(12) United States Patent
Akieda

(10) Patent No.: US 7,974,588 B2
(45) Date of Patent: Jul. 5, 2011

(54) TRANSCEIVER

(75) Inventor: Shinichiro Akieda, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 756 days.

(21) Appl. No.: 12/071,802

(22) Filed: Feb. 26, 2008

(65) Prior Publication Data

US 2009/0017778 A1    Jan. 15, 2009

(30) Foreign Application Priority Data

Jul. 13, 2007    (JP) ................................. 2007-184445

(51) Int. Cl.
*H04M 1/00*    (2006.01)
*H04B 1/03*    (2006.01)

(52) U.S. Cl. ..................... 455/90.3; 455/575.4; 361/814

(58) Field of Classification Search ................. 455/90.3, 455/575.4; 361/814
See application file for complete search history.

(56) References Cited

U.S. PATENT DOCUMENTS

| 4,363,169 A | * | 12/1982 | Nasu et al. ........................ 30/41 |
| 4,653,822 A | * | 3/1987 | Kanazawa ....................... 439/68 |
| 4,959,810 A | * | 9/1990 | Darbee et al. .................. 398/112 |
| 5,987,337 A | * | 11/1999 | Takaya ........................... 455/572 |
| 2003/0222755 A1 | * | 12/2003 | Kemper et al. ............... 340/5.61 |
| 2004/0184357 A1 | * | 9/2004 | Shen .............................. 368/220 |
| 2006/0245146 A1 | * | 11/2006 | Sugimoto et al. ............. 361/600 |
| 2006/0267844 A1 | * | 11/2006 | Yanagi et al. ........... 343/700 MS |

FOREIGN PATENT DOCUMENTS

| JP | 5-8985 | | 2/1993 |
| JP | 5-18096 | | 3/1993 |
| JP | 2000059056 A | * | 2/2000 |
| JP | 2004-068417 | | 3/2004 |
| JP | 2004-228325 | | 8/2004 |

OTHER PUBLICATIONS

Nokia 6101 and Nokia 6102 User Guide, Part No. 9240568, Issue No. 1, Nokia, 2005, retrieved on Oct. 25, 2010 from http://nds2.nokia.com/files/support/nam/phones/guides/6101_US_en.PDF.*

* cited by examiner

*Primary Examiner* — Lewis G West
*Assistant Examiner* — Gennadiy Tsvey
(74) *Attorney, Agent, or Firm* — Staas & Halsey LLP

(57) ABSTRACT

A disclosed transceiver includes a case; a transceiver module housed in the case and configured to send and receive a signal; and a battery holder configured to hold a battery supplying electric power to the transceiver module. In the disclosed transceiver, the battery holder is formed using a part of the case and is disposed alongside the transceiver module so as not to overlap the transceiver module.

10 Claims, 22 Drawing Sheets

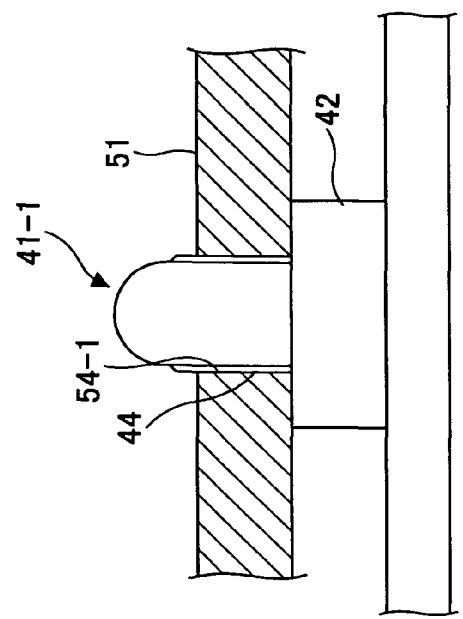
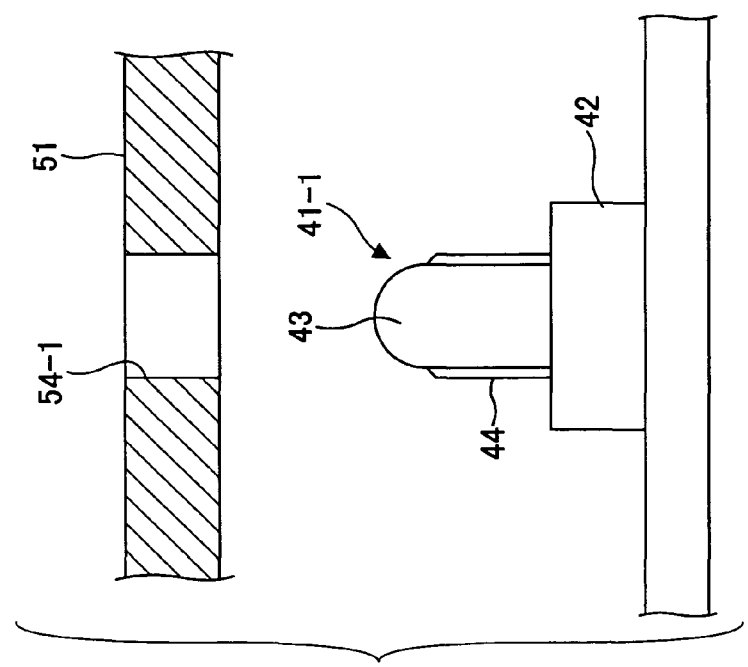
FIG.16A
FIG.16B

TRANSCEIVER

BACKGROUND OF THE INVENTION

1. Field of the Invention

The present invention generally relates to a transceiver. More particularly, the present invention relates to a small, portable transceiver including an antenna and a battery housed in a case.

2. Description of the Related Art

Research is being made on high-precision positioning systems employing ultra-wideband (UWB) wireless technology that enables use of a large bandwidth. For example, research is being made on a positioning system for determining positions of customers in a store. In the positioning system, each customer carries a transceiver (UWB tag) or moves with a shopping cart equipped with a transceiver, and the position of the customer is determined through communications between the transceiver and fixed communication apparatuses. A transceiver used in such a positioning system is preferably small and thin.

The present applicant has previously proposed a planar UWB antenna including a home-plate-shaped element pattern and a substantially-square ground pattern disposed close to each other. The configuration of the proposed UWB antenna is preferable to implement a thin transceiver. Also, a button battery (a battery shaped like a button) is preferably used to implement such a thin transceiver.

Generally, a button battery is installed in a button battery holding module provided as a separate part in a housing of a device. A button battery holding module normally includes a case, a negative electrode, and a positive electrode. Even when a small button battery is used for a transceiver, the button battery holding module occupies much space in the transceiver and therefore makes it difficult to reduce the thickness of the transceiver.

SUMMARY OF THE INVENTION

Embodiments of the present invention provide a transceiver that solves or reduces one or more problems caused by the limitations and disadvantages of the related art.

An embodiment of the present invention provides a transceiver that includes a case; a transceiver module housed in the case and configured to send and receive a signal; and a battery holder configured to hold a battery supplying electric power to the transceiver module; wherein the battery holder is formed using a part of the case and is disposed alongside the transceiver module so as not to overlap the transceiver module.

BRIEF DESCRIPTION OF THE DRAWINGS

FIGS. 16A and 16B are drawings illustrating how the pillar 41-1 is press-fit into a through hole 54-1 in a circuit board 51;

DETAILED DESCRIPTION OF THE PREFERRED EMBODIMENTS

Preferred embodiments of the present invention are described below with reference to the accompanying drawings.

Figure 1:
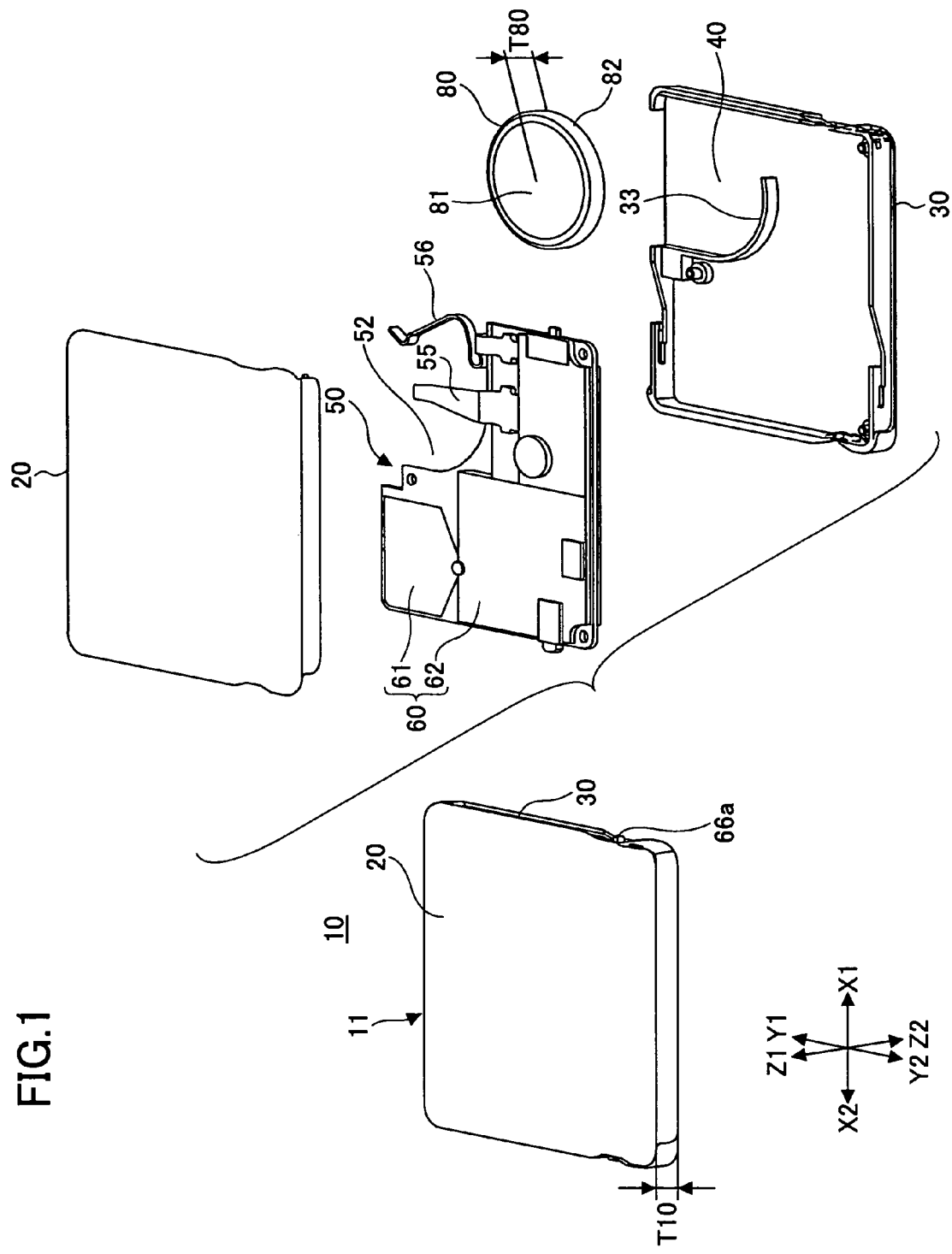
FIG. 1 is an exploded perspective view of a transceiver 10 according to an embodiment of the present invention.
Figure 2:
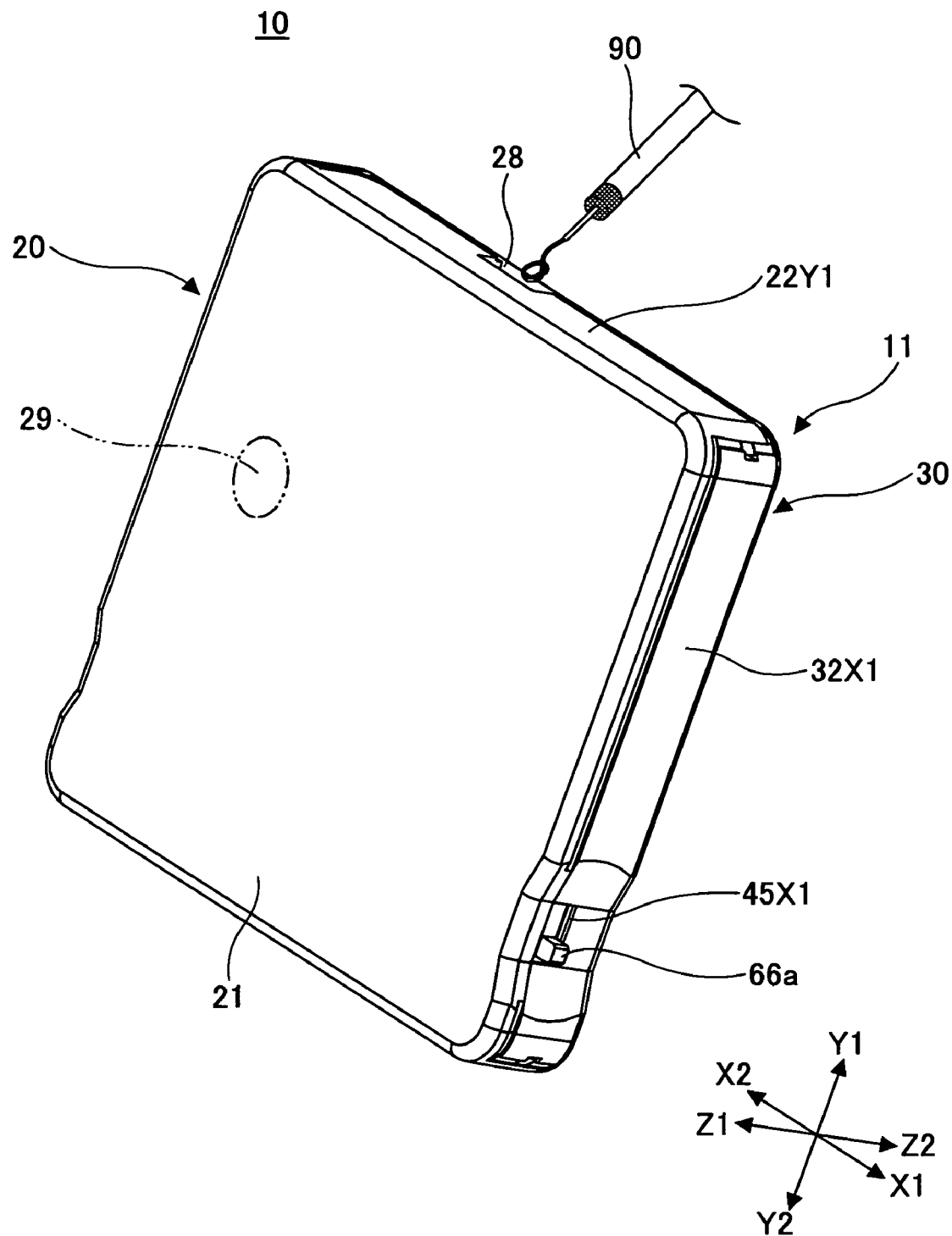
FIG. 2 is a perspective view of the transceiver 10.
Figure 3:
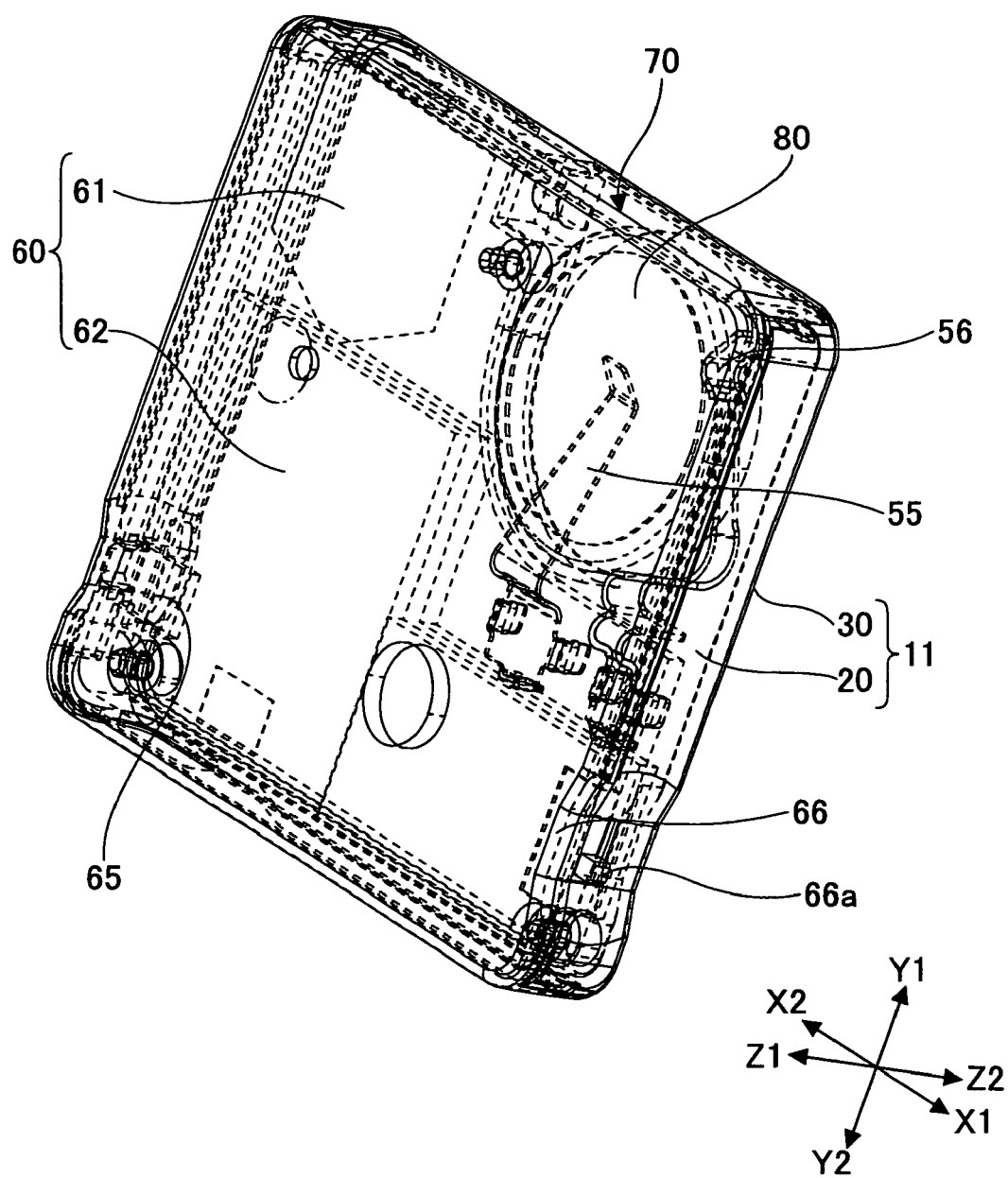
FIG. 3 is a transparent perspective view of the transceiver 10.
Figure 4A:
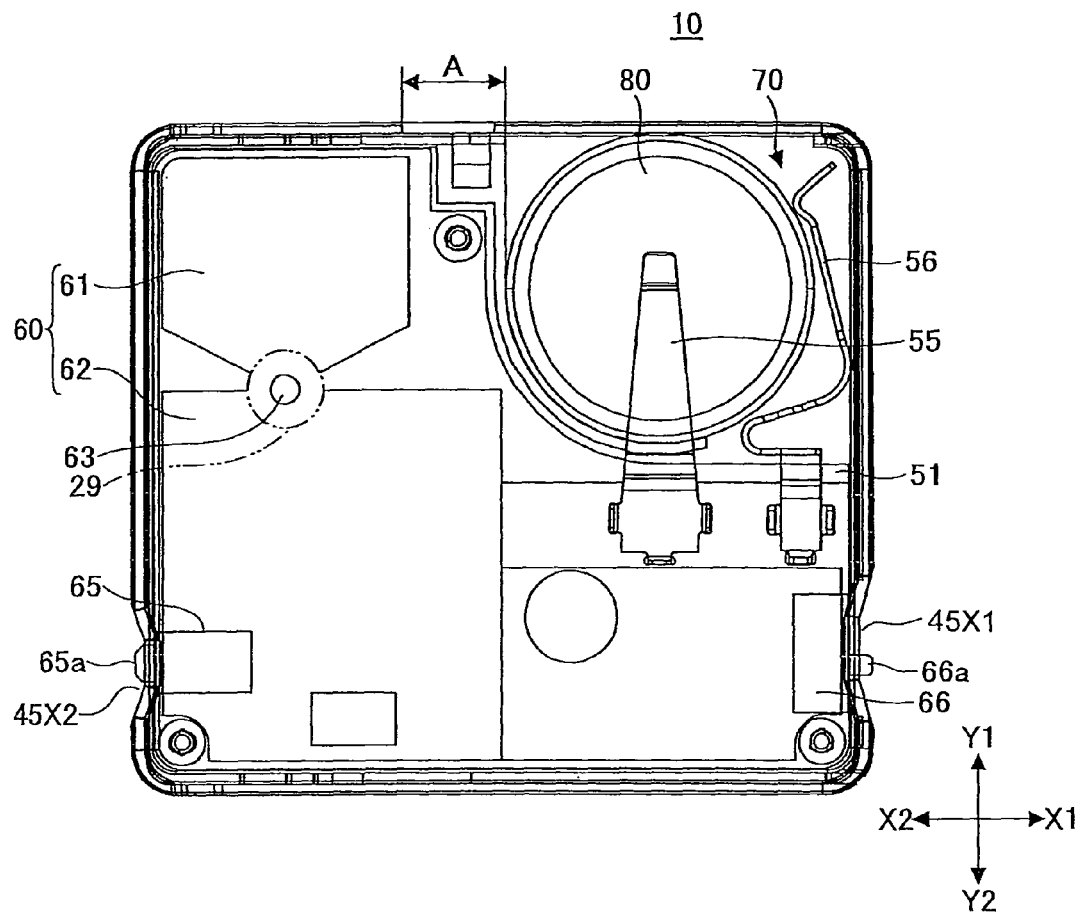
FIG. 4A is a plan view of the transceiver 10 and FIG. 4B is an elevational view of the transceiver 10.
Figure 4B:
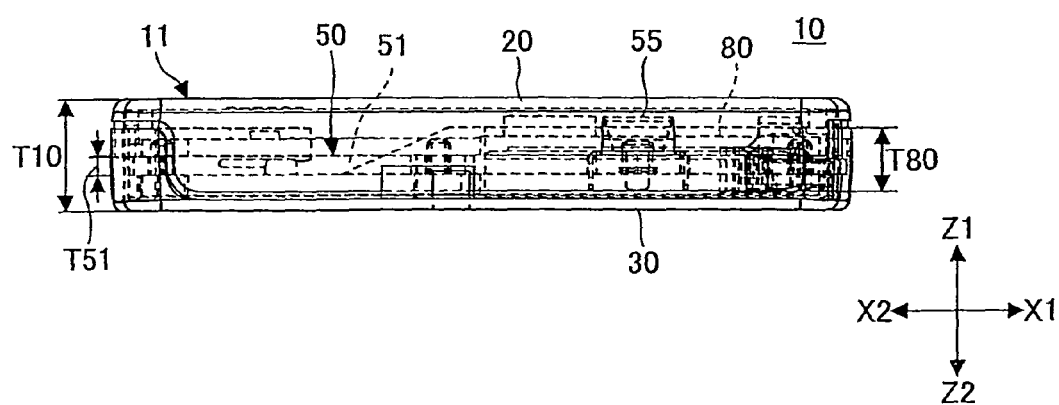

FIG. 1 is an exploded perspective view of a transceiver (UWB tag) 10 according to an embodiment of the present invention. The transceiver 10 may be used, for example, in a positioning system for determining positions of customers in a store. FIG. 2 is a perspective view of the transceiver 10. FIG. 3 is a transparent perspective view of the transceiver 10. FIG. 4A is a plan view of the transceiver 10 and FIG. 4B is an elevational view of the transceiver 10 seen from the Y2 side. In FIGs of the present application, X1-X2 indicates the width direction, Y1-Y2 indicates the length direction, and Z1-Z2 indicates the thickness (height) direction of the transceiver 10.

The transceiver 10 has a substantially-square shape in a plan view and has a thickness T10. The transceiver 10 includes a flat case 11 composed of an upper-half case 20 and a lower-half case 30 made, for example, of a synthetic resin, a transceiver module 50 housed in the case 11 for sending and receiving a signal, and a button battery holder 70 formed in the case 11 for holding a button battery 80. The button battery holder 70 is disposed alongside the transceiver module 50 so as not to overlap the transceiver module 50. The button battery holder 70 is not implemented as a module but is formed using a part of the case 11. In the thickness direction of the transceiver 10, the transceiver module 50 and the button battery holder 70 are arranged such that the transceiver module 50 is located at a height within a thickness T80 of the button battery 80 held in the button battery holder 70. At least parts of the upper-half case 20 and the lower-half case 30 surrounding an element pattern 61 described later are made of a nonmetallic material.

Figure 5D:
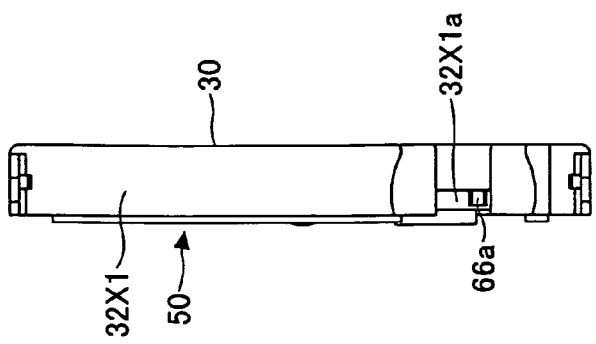
FIGS. 5A through 5E are drawings illustrating a lower-half case 30 and a transceiver module 50 fixed in the lower-half case 30.
Figure 5C:
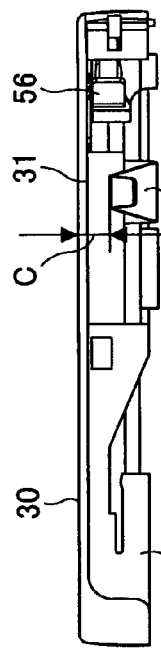

As shown in FIGS. 5A through 5E, the transceiver module 50 is fixed in the lower-half case 30. The upper-half case 20 is attached to the lower-half case 30 so as to cover the transceiver module 50. The transceiver module 50 includes a circuit board 51 shaped like a quadrangle having a cut-out. The button battery 80 is held in the button battery holder 70 formed by the cut-out of the circuit board 51 and a part of the lower-half case 30 near a corner. Thus, the button battery 80 is positioned alongside the transceiver module 50 so as not to overlap the transceiver module 50. As shown in FIG. 4B, the transceiver module 50 is disposed such that the circuit board 51 (with a thickness T51) is located at a height within the thickness T80 of the button battery 80 held in the button battery holder 70. This arrangement makes it possible to reduce the thickness of the transceiver 10. FIGS. 6A and 6B are enlarged views of the button battery holder 70 shown in FIGS. 5C and 5A.

<Transceiver Module>

Figure 7:
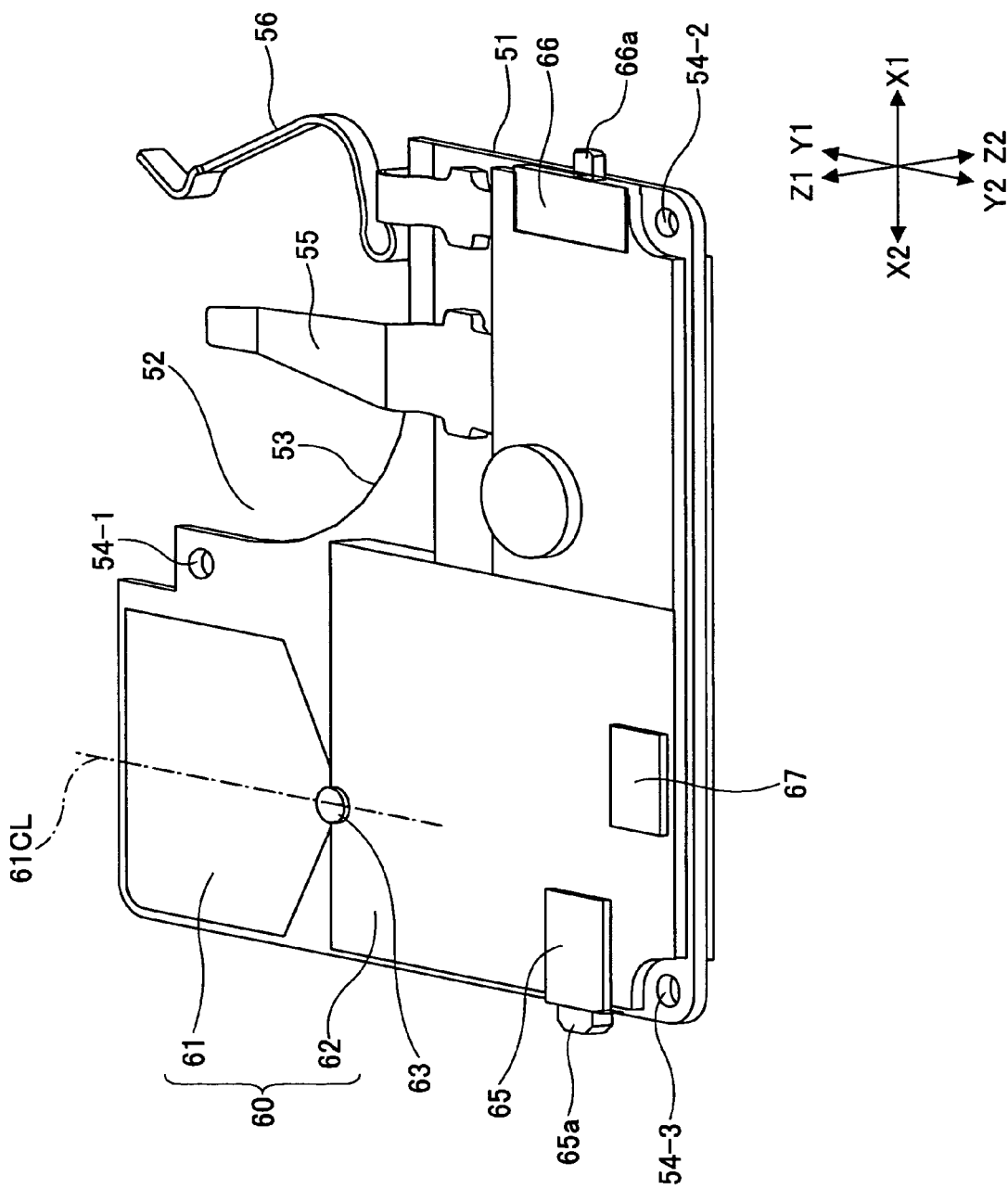
FIG. 7 is a perspective view of the transceiver module 50.

FIG. 7 is a perspective view of the transceiver module 50. The transceiver module 50 includes the circuit board 51 and a UWB antenna unit 60 disposed in the X2-side of the upper surface of the circuit board 51. A negative electrode 55 to be brought into contact with the anode of the button battery 80 and a positive electrode 56 to be brought into contact with the cathode of the button battery 80 are attached to the circuit board 51. Also, a function switch 65, a power switch 66, an external connector 67, and a small coaxial connector 63 are mounted on the circuit board 51.

The circuit board 51 fits in the lower-half case 30 and has a cut-out 52 at the Y1-X1 corner. The size and shape of the cut-out 52 correspond to those of the button battery 80 (i.e., the size and shape are determined so as to be able to accommodate the button battery 80). A rim 53 of the cut-out 52 is shaped like an arc.

The circuit board 51 has through holes 54-1, 54-2, and 54-3 approximately in the middle of the Y1 edge, at the Y2-X1 corner, and at the Y2-X2 corner, respectively. If you draw lines connecting the through holes 54-1, 54-2, and 54-3, the lines form a substantially equilateral triangle.

Figure 10:
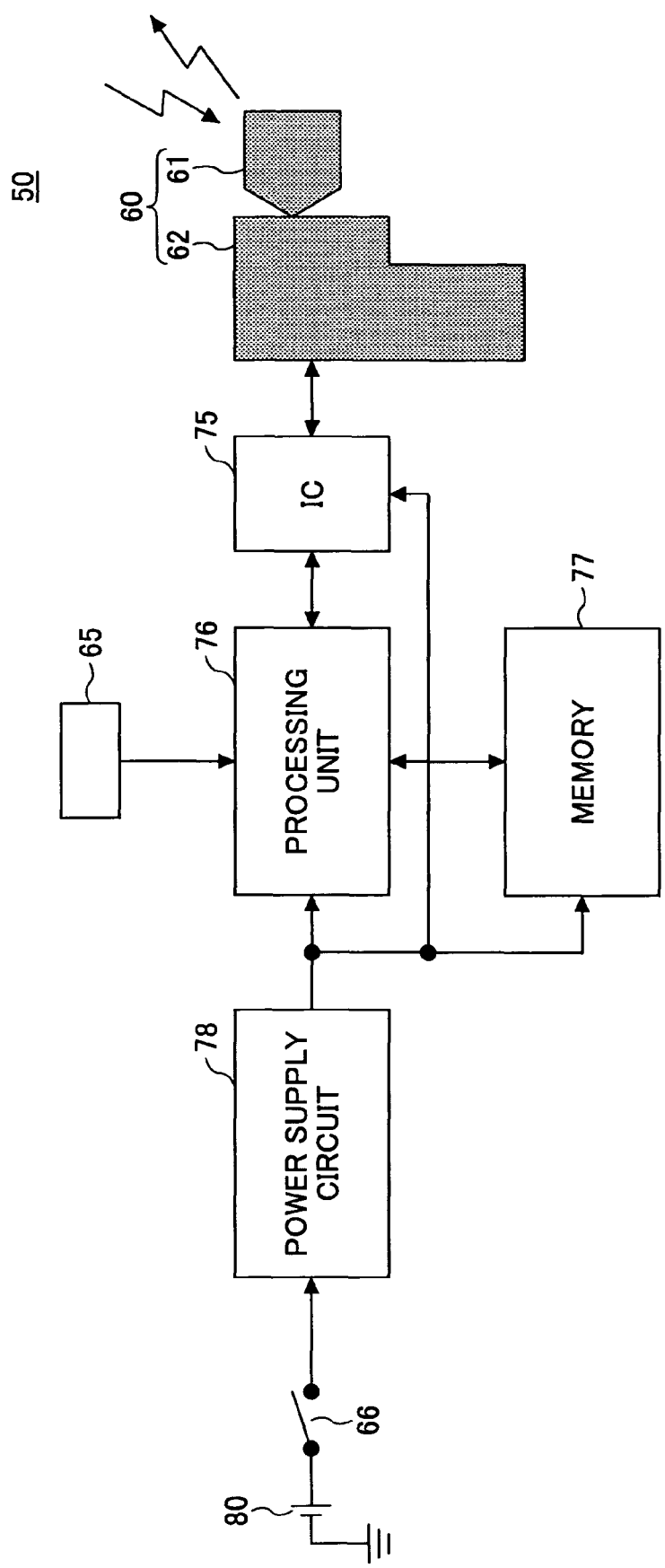
FIG. 10 is a block diagram illustrating a configuration of the transceiver module 50.

The UWB antenna unit 60 includes a home-plate-shaped element pattern 61 and a substantially L-shaped ground pattern 62 (see FIG. 10). The shape of the ground pattern 62 is not limited to an L-shape. For example, the ground pattern 62 may be shaped like a quadrangle. The element pattern 61 is symmetric with respect to its center line 61CL. The element pattern 61 is disposed in the Y1 side and the ground pattern 62 is disposed in the Y2 side of the circuit board 51. A vertex of the element pattern 61 facing the Y2 side is positioned close to the Y1 edge of the ground pattern 62. The element pattern 61 is positioned as far away as possible from the cut-out 52 (or the button battery holder 70) in the X2 direction such that the X2 edge of the element pattern 61 abuts the X2 edge of the circuit board 51. Also, the Y1 edge of the element pattern 61 abuts the Y1 edge of the circuit board 51, and the Y2 edge of the ground pattern 62 abuts the Y2 edge of the circuit board 51. Thus, the size of the circuit board 51 is made as small as possible or is just enough to accommodate the UWB antenna unit 60. The element pattern 61 and the ground pattern 62 are, for example, formed by etching on the upper surface of the circuit board 51.

The coaxial connector 63 is surface-mounted on the circuit board 51 so as to cover parts of the element pattern 61 and the ground pattern 62. The surfaces of the element pattern 61 and the ground pattern 62 are coated with an insulating film.

The UWB antenna unit 60 sends and receives impulses that are as short as about five nanoseconds.

The element pattern 61 is shifted in the X2 direction so as to increase a distance A (see FIG. 4A) between the element pattern 61 and the button battery 80 as much as possible. This configuration reduces the influence of the button battery 80 on the transmission and reception characteristics of the UWB antenna unit 60.

The function switch 65 is mounted on the X2 edge of the circuit board 51 and includes a knob 65*a* protruding in the X2 direction. The transceiver module 50 continuously sends and receives signals while the knob 65*a* is being operated.

The power switch 66 is mounted on the X1 edge of the circuit board 51 and includes a knob 66*a* protruding in the X1 direction. The knob 66*a* is used to turn on and off the power. The external connector 67 is mounted on the Y2 edge of the circuit board 51. The negative electrode 55 and the positive electrode 56 are attached to the circuit board 51 and protrude into the cut-out 52.

Figure 8:
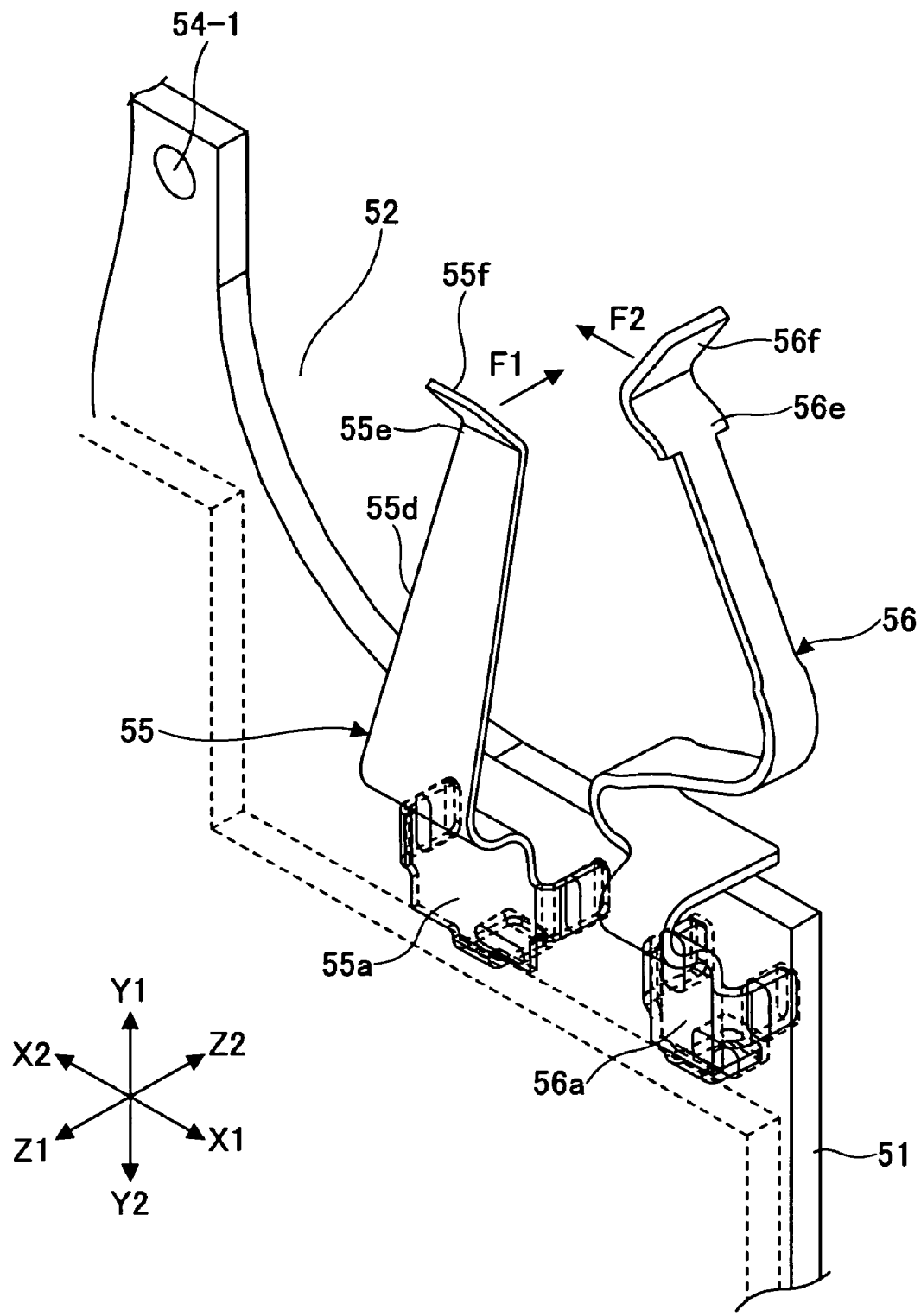
FIG. 8 is an enlarged view of a part of the button battery holder 70.
Figure 9:
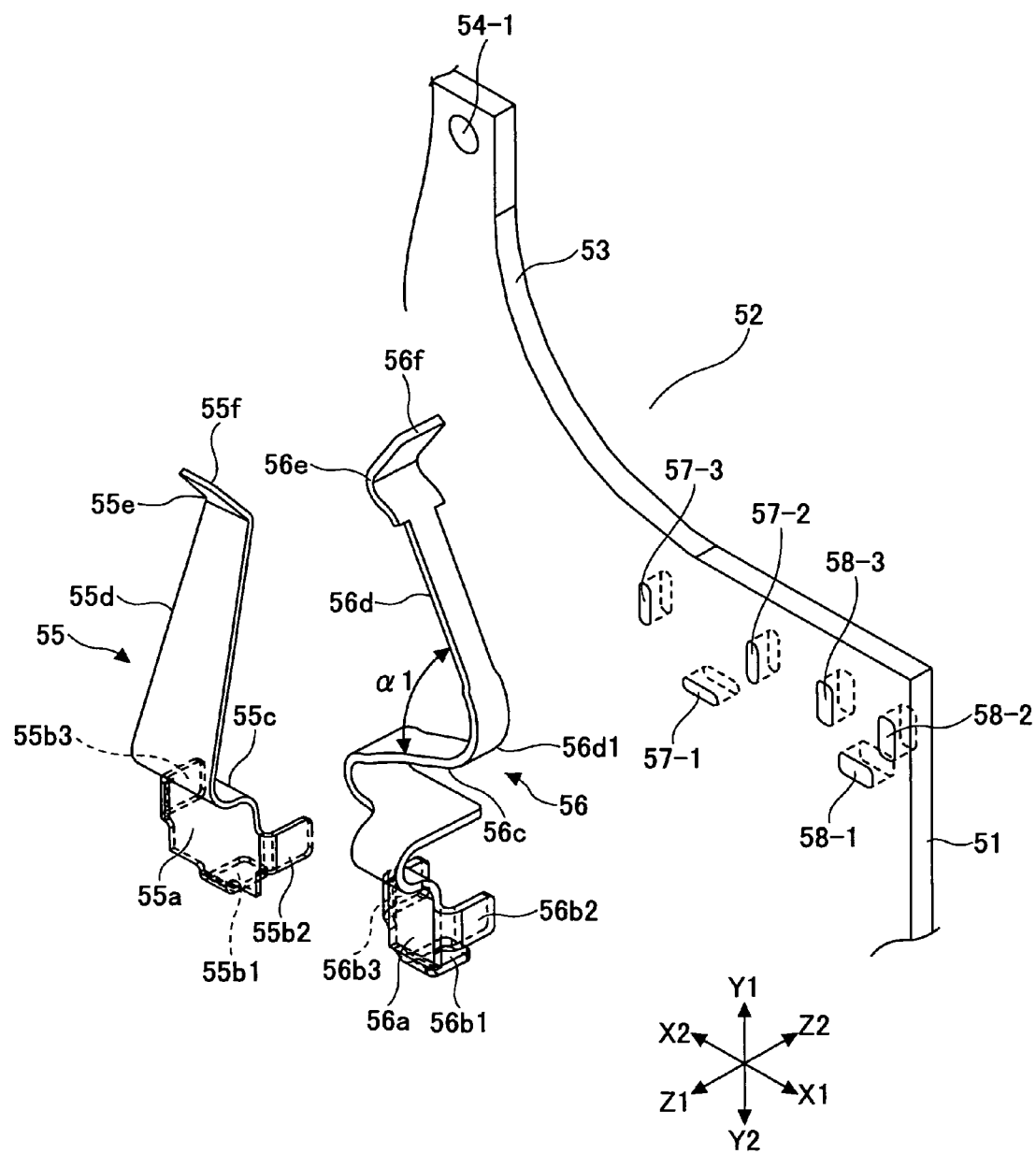
FIG. 9 is an exploded perspective view of the part of the button battery holder 70 shown in FIG. 8.

As shown in an enlarged view of FIG. 9, the negative electrode 55 is shaped like a long, thin plate and includes a base part 55*a*, an intermediate part 55*c* extending from the base part 55*a*, and a flat spring part 55*d* extending from the intermediate part 55*c*. The base part 55*a* is shaped like a quadrangle and has lugs 55*b*1 through 55*b*3 on its corresponding sides. The intermediate part 55*c* extends at an angle from the base part 55*a* in the Z1 direction. The flat spring part 55*d* slopes in the Z2 direction and extends in the Y1 direction from the intermediate part 55*c*. The tip of the flat spring part 55*d* is V-shaped and is used as a terminal part 55*e* and a button battery guide 55*f*. As shown in an enlarged view of FIG. 8, the lugs 55*b*1 through 55*b*3 of the negative electrode 55 are press-fit into the corresponding holes 57-1 through 57-3 (see FIG. 9) in the circuit board 51 and soldered to the circuit board 51. The negative electrode 55 is thereby fixed and electrically connected to the circuit board 51 and is positioned such that the terminal part 55*e* is placed approximately in the center of the cut-out 52. When the flat spring part 55*d* is pressed in the Z1 direction and elastically deformed, it accumulates an elastic force and causes a force F1 at the terminal part 55*e* in the Z2 direction. The button battery guide 55*f* slopes in the Z1 direction and extends in the Y1 direction.

As shown in the enlarged view of FIG. 9, the positive electrode 56 is shaped like a long, thin, winding plate and includes a base part 56*a*, a U-shaped intermediate part 56*c* extending from the base 56*a*, and a flat spring part 56*d* extending from the intermediate part 56*c*. The base part 56*a* is shaped like a quadrangle and has lugs 56*b*1 through 56*b*3 on its corresponding sides. The intermediate part 56*c* is bent in the Z2 direction from an end of the base part 56*a*, and is then bent in the X1 direction so that it looks like a U-shape when seen from the Z1 side. The flat spring part 56*d* curves from an end of the intermediate part 56*c* and extends in a direction between the Y1 and X2 directions. The intermediate part 56*c* and the flat spring part 56*d* form an interior angle $\alpha 1$. The intermediate part 56*c* and the flat spring part 56*d* are positioned at substantially the same height. The tip of the flat spring part 56*d* is V-shaped and is used as a terminal part 56*e* and a button battery guide 56*f*. Reference number 56*d*1 in FIG. 9 indicates a bottom part of the flat spring part 56*d*. As shown in the enlarged view of FIG. 8, the lugs 56*b*1 through 56*b*3 of the positive electrode 56 are press-fit into the corresponding holes 58-1 through 58-3 in the circuit board 51 and soldered to the circuit board 51. The positive electrode 56 is thereby fixed and electrically connected to the circuit board 51 and is positioned such that the flat spring part 56*d*, the terminal part 56*e*, and the button battery guide 56*f* are placed in the X1 side of the cut-out 52. When the flat spring part 56*d* is pressed in a direction to increase the interior angle $\alpha 1$ and elastically deformed, it accumulates an elastic force and causes a force F2 at the terminal part 56e in the X2 direction. As described later, the button battery guide 56f guides the button battery 80 being inserted into the button battery holder 70.

FIG. 10 is a block diagram illustrating a configuration of the transceiver module 50. In addition to the UWB antenna unit 60, the transceiver module 50 includes a UWB communication IC chip 75, a processing unit 76, a memory 77, and a power supply circuit 78.

The UWB communication IC chip 75 generates impulses based on a signal from the processing unit 76 and restores a signal from impulses received by the UWB antenna unit 60.

The processing unit 76 performs various processes according to a control program. The processing unit 76 is connected to the function switch 65.

The memory 77 is composed of a RAM and/or a ROM and stores the control program to be executed by the processing unit 76. The memory 77 is also used as working storage by the processing unit 76.

The power supply circuit 78 is connected via the power switch 66 to the button battery 80, and regulates a voltage from the button battery 80 and applies the regulated voltage as a driving voltage to the UWB communication IC chip 75, the processing unit 76, and the memory 77. The power supply circuit 78 may be omitted and the transceiver 10 may be configured such that a voltage from the button battery 80 is directly supplied to the UWB communication IC chip 75, the processing unit 76, and the memory 77.

<Lower-Half Case>

Figure 11:
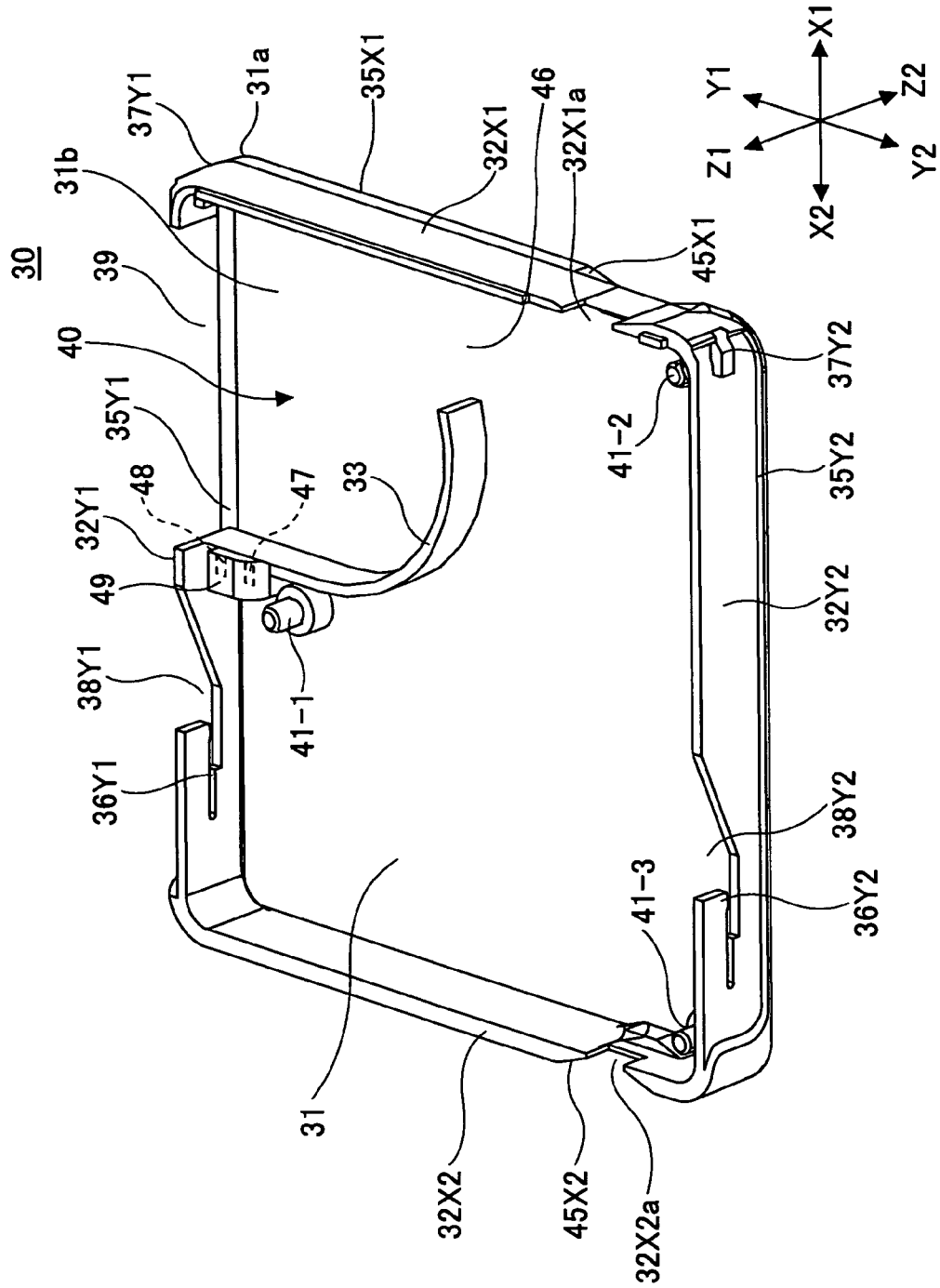
FIG. 11 is a perspective view of the lower-half case 30.
Figure 12:
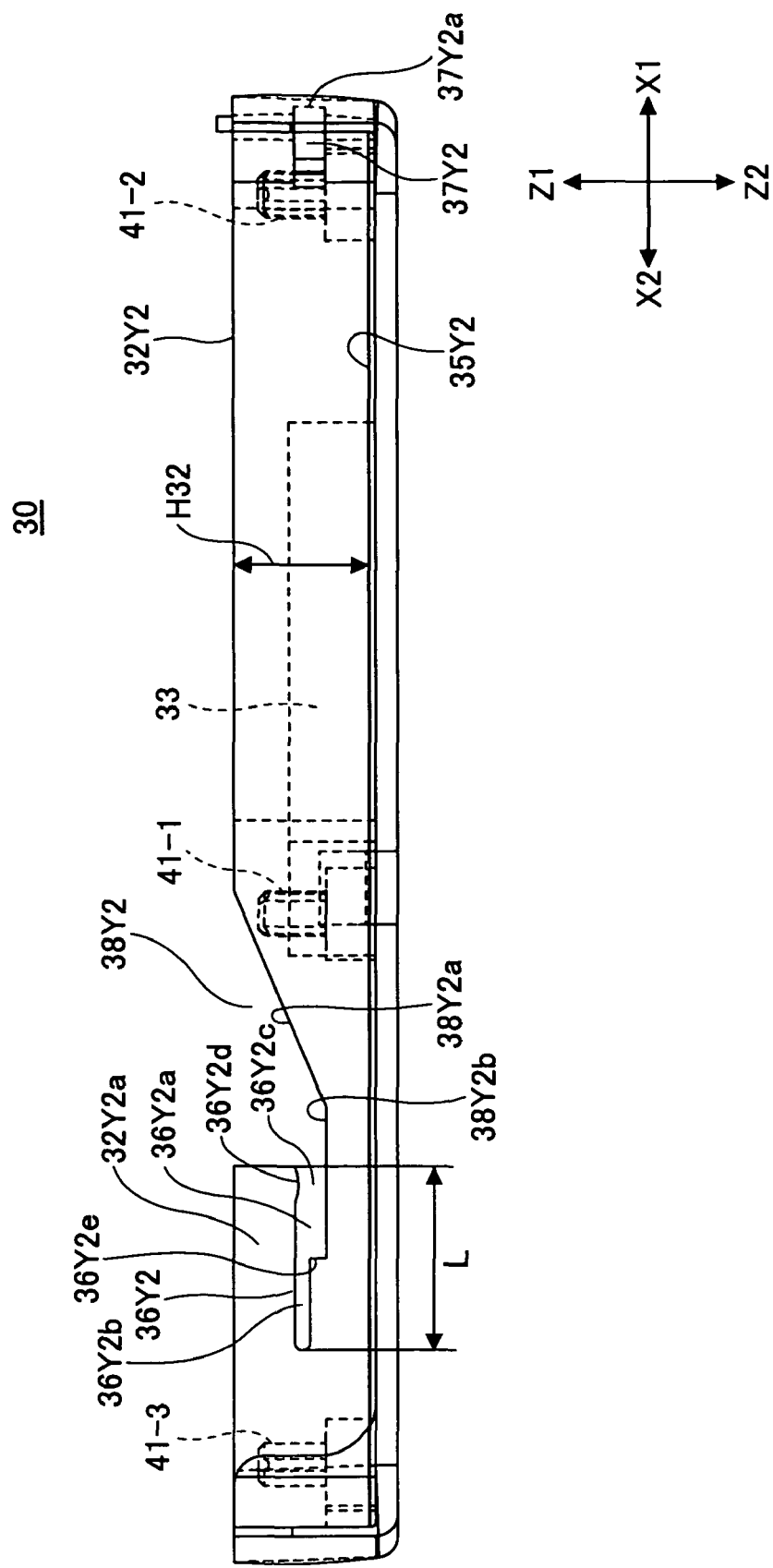
FIG. 12 is an enlarged elevational view of the lower-half case 30.

FIG. 11 is a perspective view of the lower-half case 30, and FIG. 12 is an enlarged elevational view of the lower-half case 30. The lower-half case 30 includes a substantially-square shaped bottom plate 31, side plates 32X1, 32X2, 32Y1, and 32Y2 rising from the corresponding edges of the bottom plate 31, a partition 33, and pillars 41-1 through 41-3. The side plates 32X1, 32X2, 32Y1, and 32Y2 have a height H32 that is slightly larger than the thickness T80 of the button battery 80.

Each of the side plates 32X1, 32Y1, and 32Y2 is positioned inside of the bottom plate 31 at a distance from the corresponding edge of the bottom plate 31. The distance corresponds to the thickness of a side plate (described later) of the upper-half case 20. As a result, narrow projecting parts 35X1, 35Y1, and 35Y2 are formed outside of the side plates 32X1, 32Y1, and 32Y2 at the X1, Y1, and Y2 edges of the bottom plate 31.

Cut-outs 32X1a and 32X2a are formed, respectively, in the side plates 32X1 and 32X2 near the Y2 ends so that the knobs 66a and 65a can protrude from the corresponding cut-outs 32X1a and 32X2a.

Also, recesses 45X1 and 45X2 are formed in corresponding portions of the side plates 32X1 and 32X2 and the bottom plate 31 near the cut-outs 32X1a and 32X2a such that the cut-outs 32X1a and 32X2a are located at the bottoms of the corresponding recesses 45X1 and 45X2.

In the side plate 32Y2, a slit 36Y2 is formed near its X2 end and a slit 37Y2 is formed at its X1 end. The slits 36Y2 and 37Y2 extend laterally in the X1-X2 direction or in the length direction of the side plate 32Y2. Since the slits 36Y2 and 37Y2 extend in the length direction of the side plate 32Y2, the lengths of the slits 36Y2 and 37Y2 can be determined freely without being limited by the height H32 of the side plate 32Y2.

A length L of the slit 36Y2 is 1.5 times as large as the height H32 of the side plate 32Y2. Also, the slit 36Y2 is positioned in the middle of the height of the side plate 32Y2. A cut 38Y2 is also formed in the side plate 32Y2 at a position closer to the X1 end than the slit 36Y2. The cut 38Y2 extends from the top of the side plate 32Y2 toward an entry 36Y2c of the slit 36Y2. The cut 38Y2 is composed of a sloping part 38Y2a sloping from the top of the side plate 32Y2 toward the entry 36Y2c and a horizontal part 38Y2b extending horizontally from one end of the sloping part 38Y2a (the bottom of the cut 38Y2) toward the entry 36Y2c.

The slit 36Y2 is composed of an engaging slit 36Y2a and an extension slit 36Y2b extending further from the engaging slit 36Y2a in the X2 direction. As a result of forming the slit 36Y2 in the side plate 32Y1, a cantilever 32Y2a is formed above the slit 36Y2. The X2 end of the cantilever 32Y2a is fixed and the X1 end is free. The cantilever 32Y2a has the length L that is about 1.5 times as large as the height H32 of the side plate 32Y2. With the extension slit 36Y2b, the cantilever 32Y2a takes on a spring characteristic and can be elastically bent in the Z1 direction. The elasticity of the cantilever 32Y2a reduces stress concentration that occurs at the back of the extension slit 36Y2b when the cantilever 32Y2a is bent in the Z1 direction. The engaging slit 36Y2a has a locking protrusion 36Y2d at the entry 36Y2c and a stopper step 36Y2e at the other end that engages a protrusion 25Y2 (described later) being inserted into the engaging slit 36Y2a (and thereby stops the protrusion 25Y2 from entering further into the slit 36Y2).

The slit 37Y2 has an entry 37Y2a at its X1 end.

As shown in FIG. 11, the side plate 32Y1 also has slits 36Y1 and 37Y1 corresponding to the slits 36Y2 and 37Y2 and formed in substantially the same manner.

The side plate 32Y1 is composed of an X1-side portion and an X2-side portion and has an opening 39 in the X1-side portion for inserting and removing the button battery 80.

The partition 33 rising from the bottom plate 31 extends from the X1 end of the X2-side portion of the side plate 32Y1 toward the center of the lower-half case 30 and curves in the X1 direction. There is an opening 46 between an end of the partition 33 and the side plate 32X1 for accommodating the positive electrode 56.

A button battery housing 40 for housing the button battery 80 is formed by the side plate 32X1, the partition 33, and a portion 31b of the bottom plate 31 surrounded by the side plate 32X1 and the partition 33. The Y1 side of the button battery housing 40 is the opening 39 described above. When the transceiver module 50 is fit in the lower-half case 30, the cut-out 52 of the circuit board 51 also forms a part of the button battery housing 40. The portion 31b is located around a corner 31a of the X1 edge and the Y1 edge of the bottom plate 31 and corresponds to the cut-out 52 of the circuit board 51. The portion 31b supports the lower surface of the button battery 80. On the other hand, the partition 33 supports a part of the circumferential surface of the button battery 80.

The pillars 41-1, 41-2, and 41-3 protrude from the bottom plate 31. The pillar 41-1 is positioned near the Y1 edge of the bottom plate 31 approximately in the middle of the X1-X2 direction, the pillar 41-2 is positioned at the X1-Y2 corner, and the pillar 41-3 is positioned at the X2-Y2 corner. Thus, the pillars 41-1, 41-2, and 41-3 are placed at positions corresponding to those of the through holes 54-1, 54-2, and 54-3 of the circuit board 51.

Figure 13A:
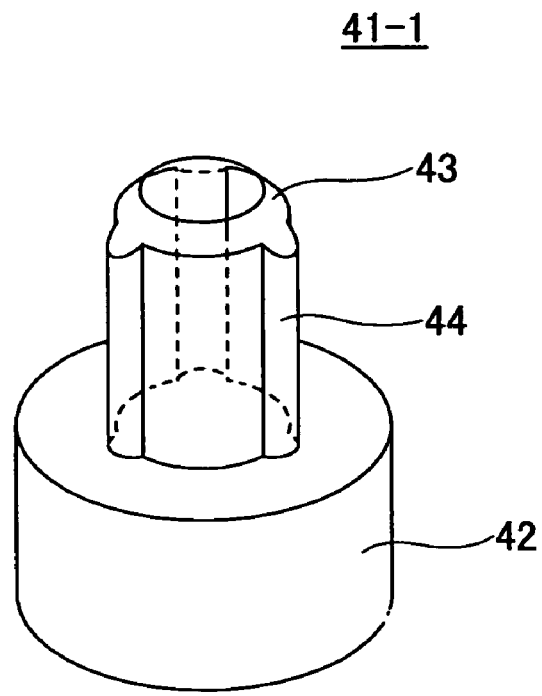
FIGS. 13A and 13B are enlarged views of a pillar 41-1 shown in FIG. 11.
Figure 13B:
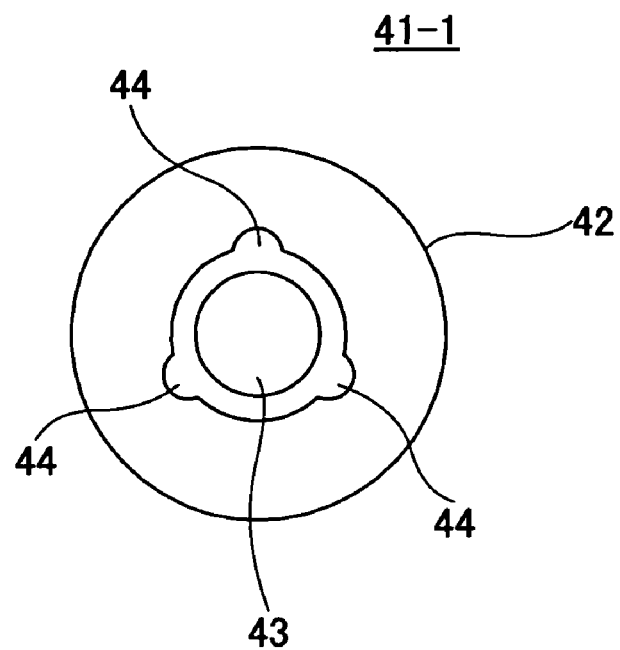

As shown in enlarged views of FIGS. 13A and 13B, the pillar 41-1 includes a pedestal 42, a column 43, and ribs 44 protruding from the circumferential surface of the column 43. The ribs 44 extend in the axial direction of the column 43 such that they trisect the column 43. The pillars 41-2 and 41-3 have substantially the same configuration as that of the pillar 41-1.

A small hole 47 is formed in the bottom plate 31 near the midpoint of the Y1 edge and a hole 48 is formed in the X2-side portion of the side plate 32Y1 near its X1 end and close to the bottom plate 31. A strap may be put through the holes 47 and 48. A bridge 49 is formed near the holes 47 and 48 in the lower-half case 30 to guide a strap to be put through the holes 47 and 48.

<Upper-Half Case>

Figure 14:
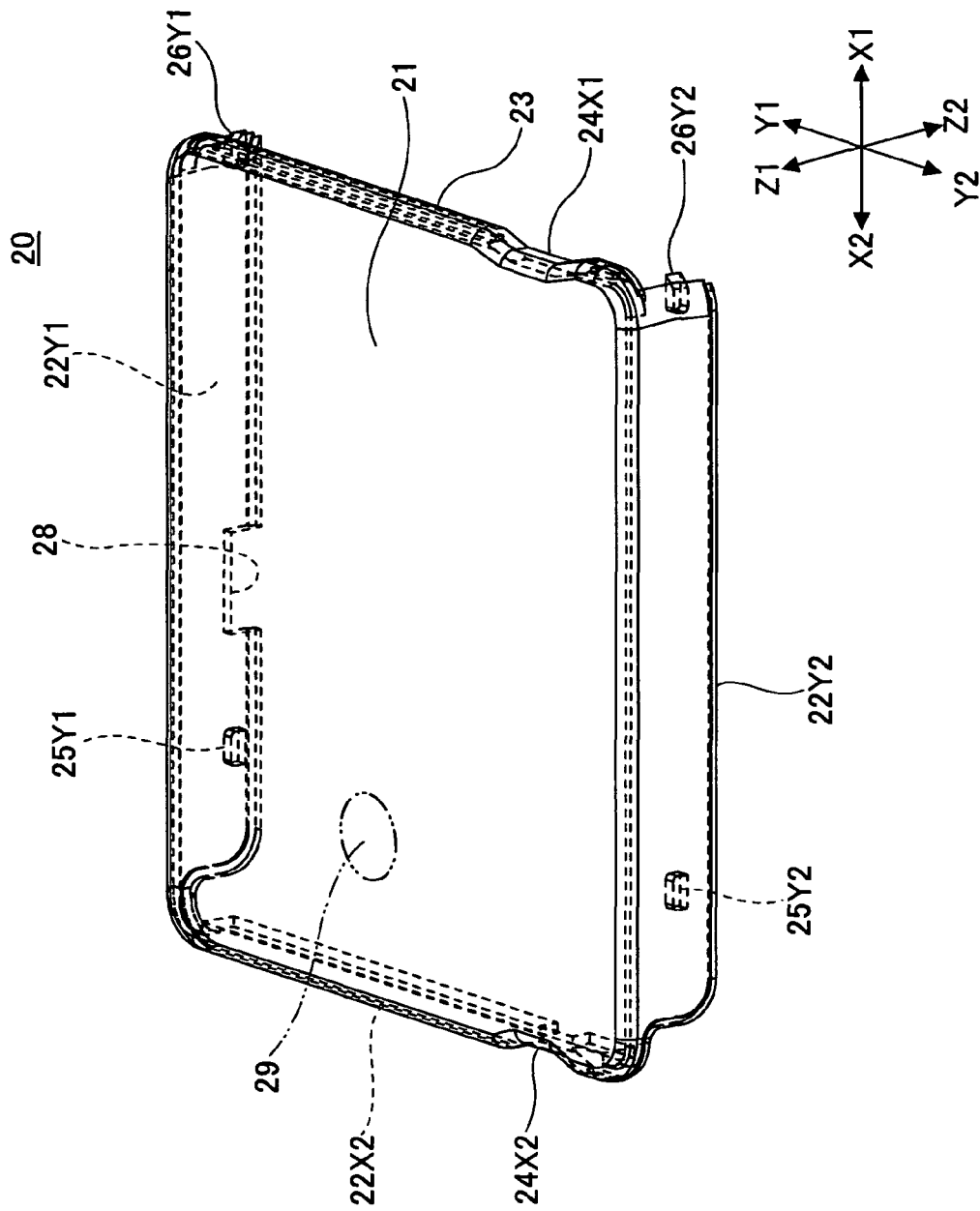
FIG. 14 is a perspective view of an upper-half case 20.
Figure 15:
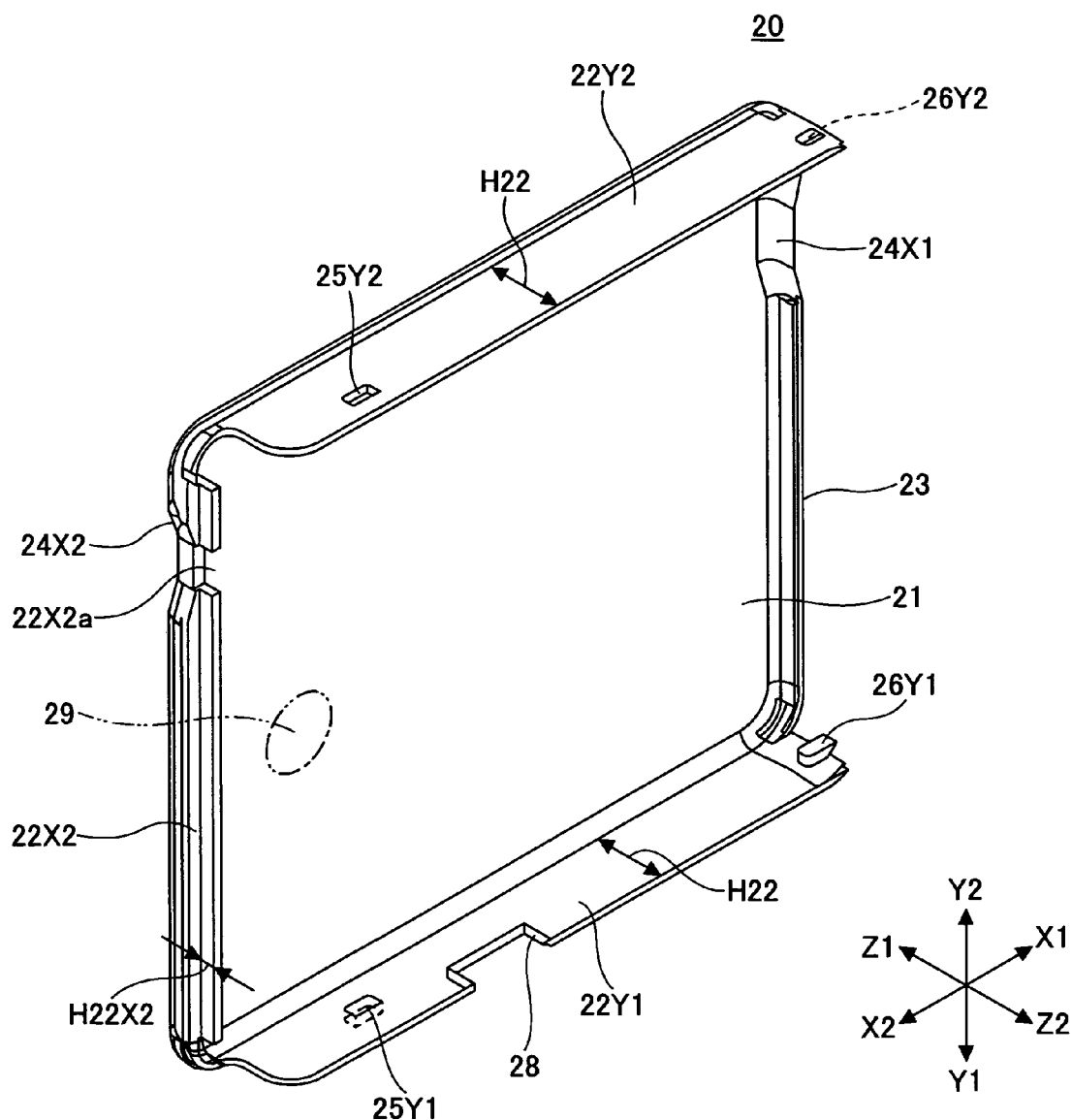
FIG. 15 is a perspective view of the upper-half case 20 in an upright position.

FIG. 14 shows the upper-half case 20 seen from above. FIG. 15 shows the upper-half case 20 in an upright position. The upper-half case 20 includes a substantially-square shaped top plate 21, a side plate 22Y1 extending in the Z2 direction from the Y1 edge of the top plate 21, a side plate 22Y2 extending in the Z2 direction from the Y2 edge of the top plate 21, and a side plate 22X2 extending in the Z2 direction from the X2 edge of the top plate 21. The side plates 22Y1 and 22Y2 have a height H22 that is substantially the same as the height H32 of the side plates 32Y1 and 32Y2 of the lower-half case 30. The side plate 22X2 has a height H22X2 that is a half of the height H22. There is no side plate on the X1 edge of the top plate 21. Instead, the top plate 21 has a protrusion 23 protruding in the Z2 direction from the X1 edge.

Recesses 24X1 and 24X2 corresponding to the recesses 45X1 and 45X2 of the lower-half case 30 are formed in the top plate 21.

A cut-out 22X2a is formed in the side plate 22X2 at a position corresponding to the recess 24X2.

Protrusions 25Y1 and 26Y1 are formed on the inner surface of the side board 22Y1 at positions corresponding to the slits 36Y1 and 37Y1 of the lower-half case 30. Similarly, protrusions 25Y2 and 26Y2 are formed on the inner surface of the side board 22Y2 at positions corresponding to the slits 36Y2 and 37Y2 of the lower-half case 30.

A cut-out 28 is formed in the side board 22Y1 to prevent the side board 22Y1 from interfering with a strap put through the holes 47 and 48 of the lower-half case 30.

Also, a hole 29 may be formed in the top plate 21 at a position corresponding to the coaxial connector 63.

<Assembly of Transceiver>

An exemplary process of assembling the transceiver 10 is described below to illustrate the overall configuration of the transceiver 10.

First, the transceiver module 50 is installed in the lower-half case 30 (see FIGS. 5A through 5E and FIGS. 16A and 16B). Second, the upper-half case 20 is attached to the lower-half case 30 (see FIGS. 17A through 18C).

[Installing the Transceiver Module 50 in the Lower-Half Case 30]

The transceiver module 50 is installed in the lower-half case 30 by press-fitting the pillars 41-1, 41-2, and 41-3 into the corresponding through holes 54-1, 54-2, and 54-3 of the circuit board 51 from the Z2 side. FIGS. 5A through 5E illustrate the transceiver module 50 installed in the lower-half case 30.

As shown in enlarged views of FIGS. 16A and 16B, the column 43 of the pillar 41-1 is press-fit into the through hole 54-1 until the pedestal 42 touches the circuit board 51. When press-fit into the through hole 54-1, the ribs 44 are squashed. The pillars 41-2 and 41-3 are also press-fit into the corresponding through holes 54-2 and 54-3 in substantially the same manner.

With the pillars 41-1, 41-2, and 41-3 press-fit into the through holes 54-1, 54-2, and 54-3, the transceiver module 50 is firmly fixed to the lower-half case 30.

With the above configuration, the transceiver module 50 can be firmly fixed approximately in the middle of the height of the lower-half case 30 by just press-fitting the pillars 41-1, 41-2, and 41-3 into the through holes 54-1, 54-2, and 54-3.

Thus, the above configuration eliminates the need of, for example, thermal caulking where parts of the pillars 41-1, 41-2, and 41-3 protruding in the Z1 direction from the circuit board 51 are heated and melted by ultrasonic vibration, and thereby improves the assembly efficiency.

Referring to FIG. 6B, the rim 53 of the cut-out 52 of the circuit board 51 runs along the partition 33. The negative electrode 55 crosses over the partition 33 and protrudes into the button battery housing 40. The tip of the negative electrode 55 is located approximately in the center of the button battery housing 40 and is at a height P from the bottom plate 31 in the Z1 direction as shown in FIG. 6A. A distance C between the terminal part 55e and the inner surface of the bottom plate 31 is smaller than the thickness T80 of the button battery 80. The positive electrode 56 protrudes through the opening 46 into the X1 side of the button battery housing 40. The bottom part 56d1 of the flat spring part 56d is located close to the inner surface of the side plate 32X1. The terminal part 56e faces the partition 33.

The button battery guides 55f and 56f are viewable from the opening 39. The button battery guide 55f slopes in the Z1 direction as it comes close to the opening 39, and the button battery guide 56f slopes in the X1 direction as it comes closer to the opening 39.

The button battery housing 40, the negative electrode 55, and the positive electrode 56 constitute the button battery holder 70. As described above, the button battery housing 40 of the button battery holder 70 is formed using a part of the lower-half case 30. This configuration makes it possible to reduce the thickness (or height) of the transceiver 10.

Figure 5A:
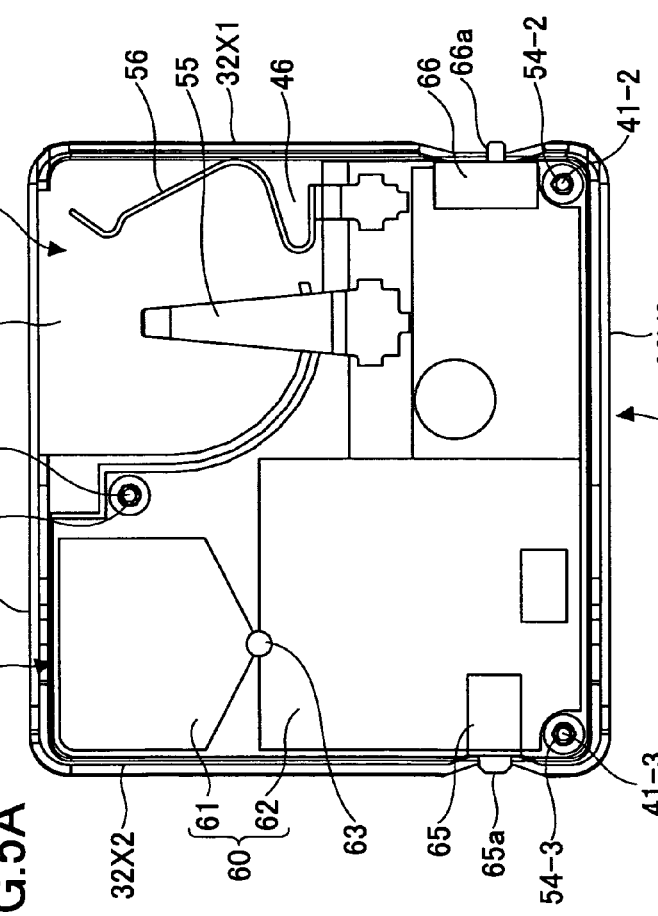
Figure 5B:
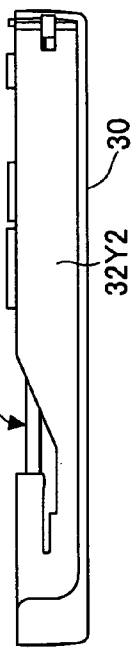
Figure 5E:
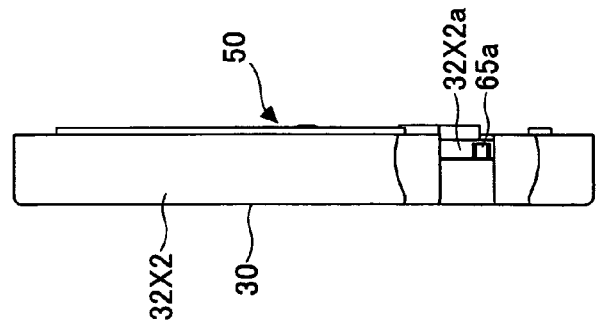
Figure 6A:
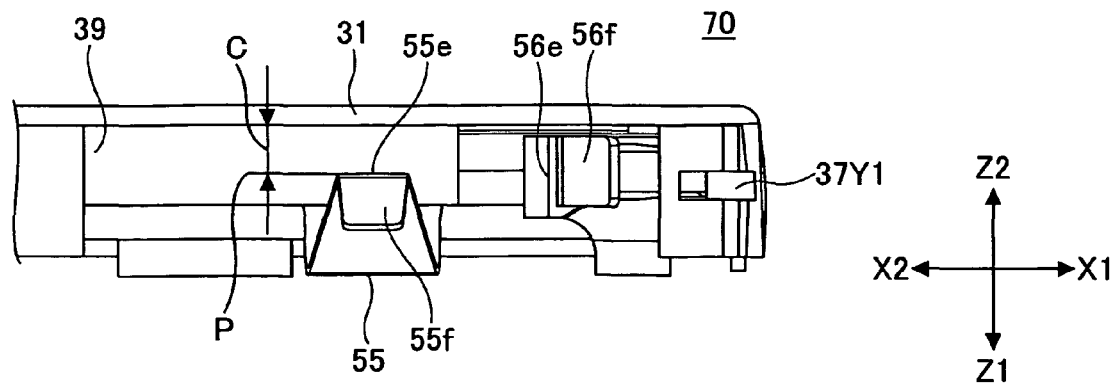
FIGS. 6A and 6B are enlarged views of a button battery holder 70 shown in FIGS. 5C and 5A.
Figure 6B:
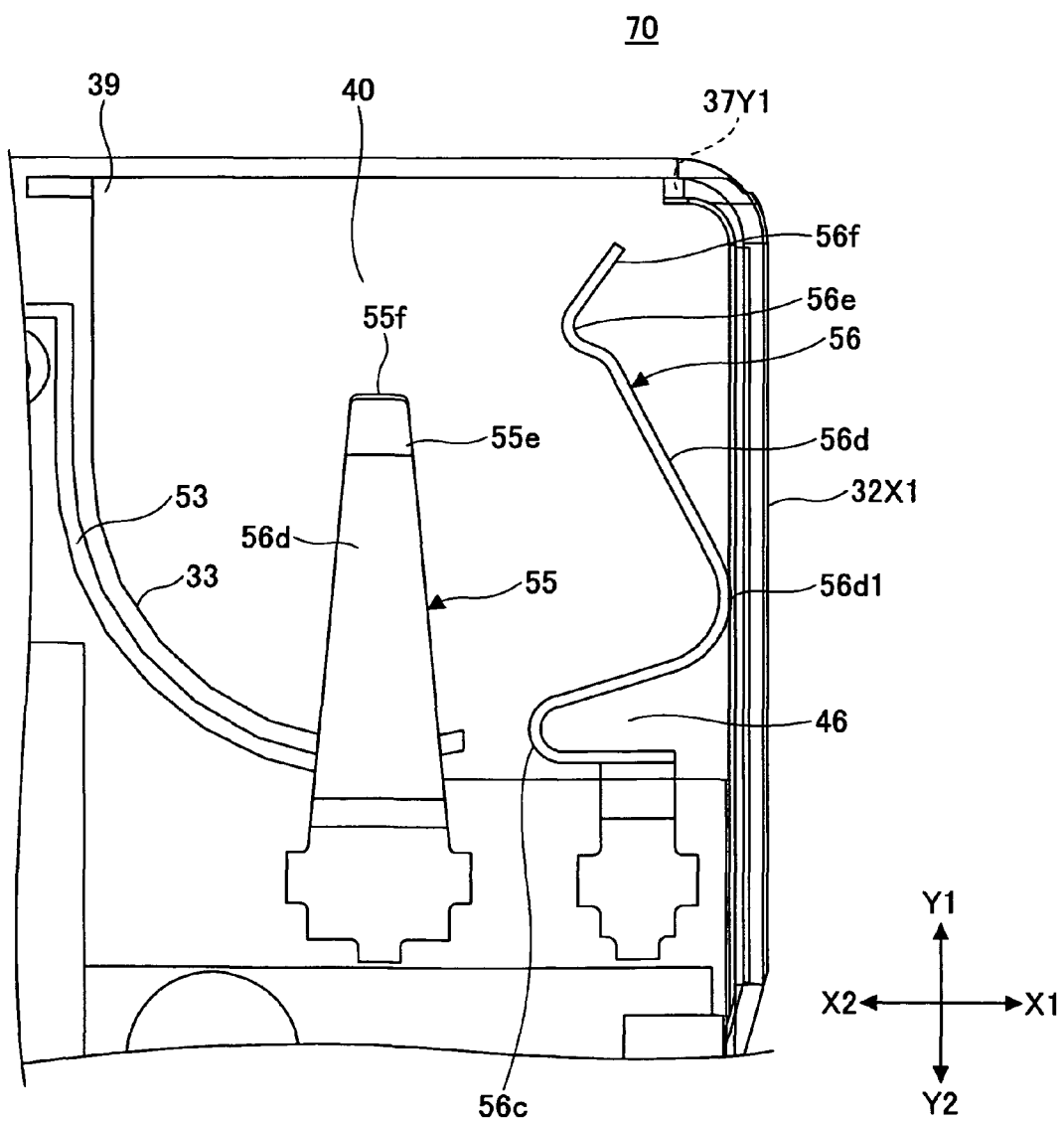

The knob 65a of the function switch 65 protrudes through the cut-out 32X2a in the X2 direction as shown in FIGS. 5A and 5E. Also, the knob 66a of the power switch 66 protrudes through the cut-out 32X1a in the X1 direction as shown in FIGS. 5A and 5D.

[Attaching the Upper-Half Case 20 to the Lower-Half Case 30]

Referring to FIGS. 17A through 18C, the upper-half case 20 is placed on the lower-half case 30 in a position shifted in the X1 direction with respect to the lower-half case 30. Then, the upper-half case 20 is slid in the X2 direction until it completely covers the lower-half case 30 and is locked in position. Through this process, the upper-half case 20 is attached to the lower-half case 30 as shown in FIGS. 2, 3, 4A, and 4B.

In this process, the protrusions 25Y2 and 26Y2 on the side plate 22Y2 are fit into the corresponding slits 36Y2 and 37Y2, and the protrusions 25Y1 and 26Y1 on the side plate 22Y1 are fit into the corresponding slits 36Y1 and 37Y1 in a similar manner. In FIGS. 17A through 18C, the Y1 sides of the upper-half case 20 and the lower-half case 30 are not shown, and descriptions regarding the Y1 sides are omitted here.

Figure 17A:
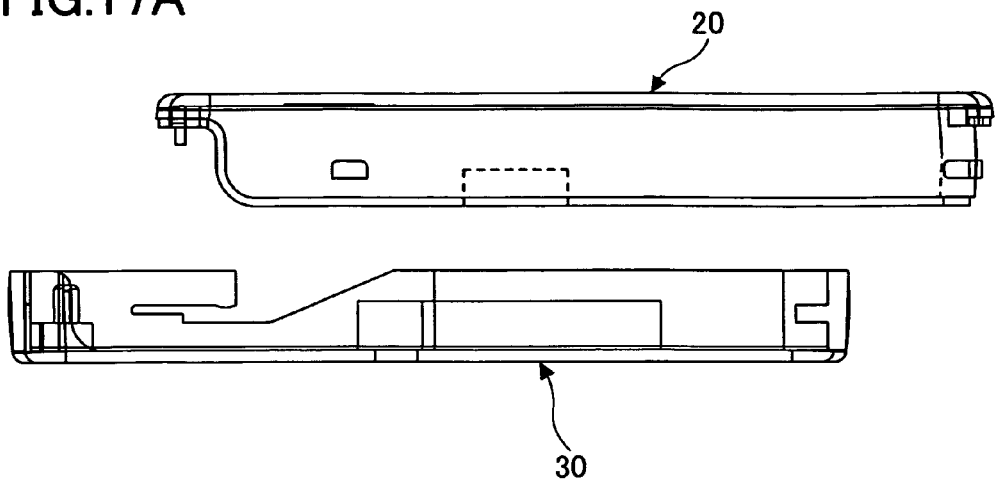
FIGS. 17A through 17C are drawings illustrating a first part of a process of attaching the upper-half case 20 to the lower-half case 30.
Figure 17B:
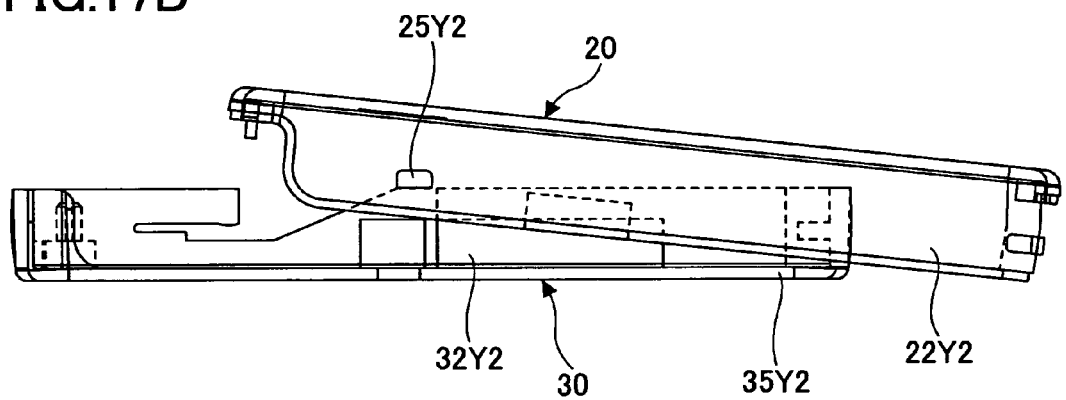

The above attaching process is described below in more detail. First, an assembler (this can be a person or a machine) places the upper-half case 20 on the lower-half case 30 in a position shifted in the X1 direction as shown in FIGS. 17A and 17B. In this position, the upper-half case 20 is tilted with respect to the lower-half case 30. More specifically, the side plates 22Y1 and 22Y2 of the upper-half case 20 are placed, respectively, at the outside of the side plates 32Y1 and 32Y2 of the lower-half case 30; the lower ends of the side plates 22Y1 and 22Y2, respectively, touch the projecting parts 35Y1 and 35Y2; and the protrusions 25Y1 and 25Y2, respectively, touch the top ends of the side plates 32Y1 and 32Y2 as shown in FIG. 17B.

Then, the assembler slides the upper-half case 20 in the X2 direction.

Figure 17C:
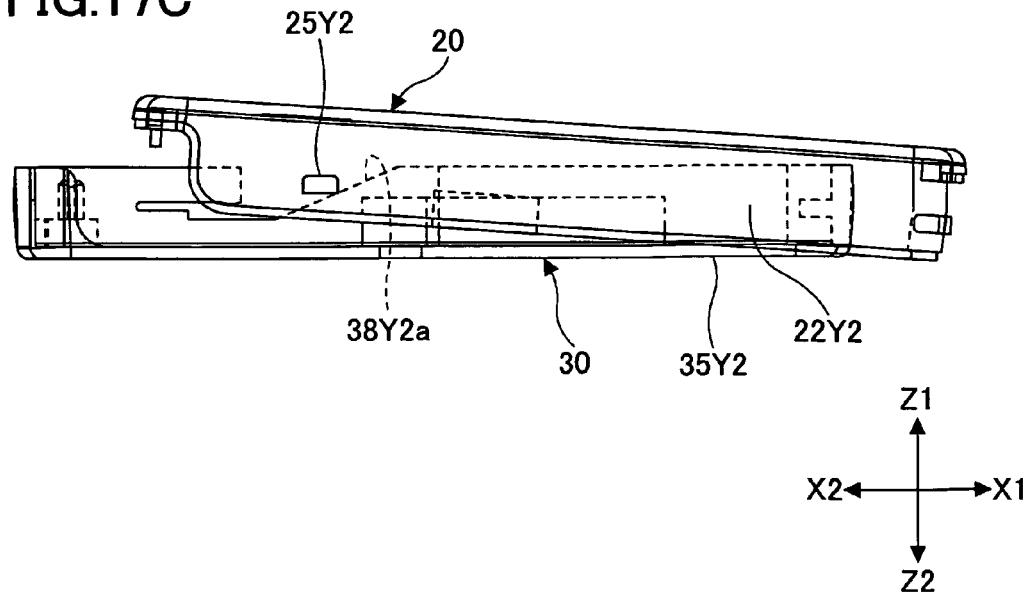
Figure 18A:
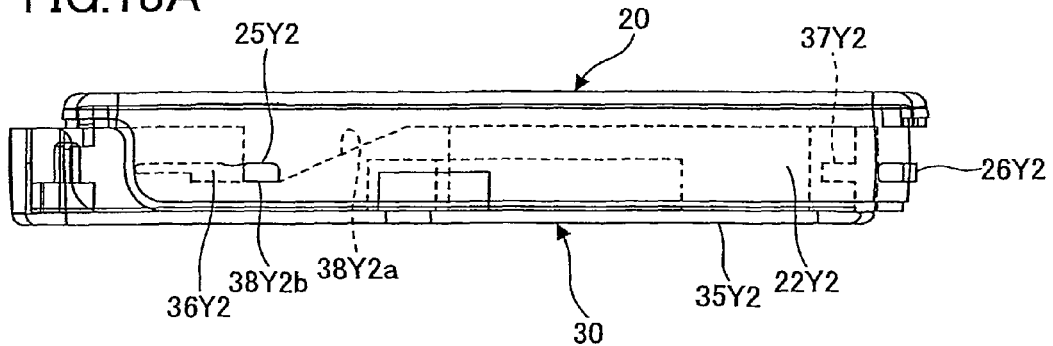
FIGS. 18A through 18C are drawings illustrating a second part of the process of attaching the upper-half case 20 to the lower-half case 30.

When the upper-half case 20 is slid in the X2 direction, the protrusion 25Y2 slides down the sloping part 38Y2a as shown in FIG. 17C and moves into the horizontal part 38Y2b as shown in FIG. 18A. As a result, the X2 end of the upper-half case 20 comes down and the upper-half case 20 becomes horizontal.

Figure 18B:
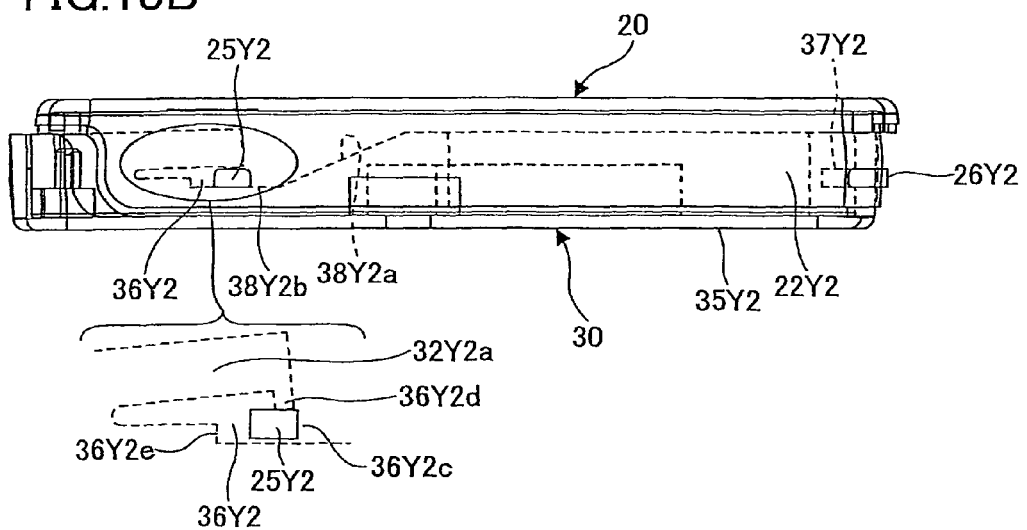
Figure 18C:
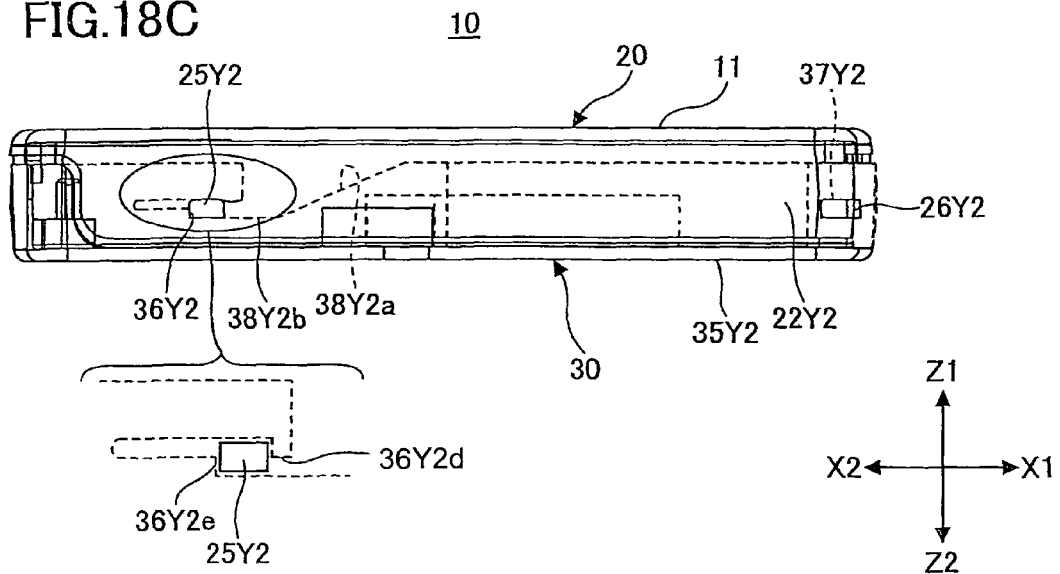

When the upper-half case 20 is slid further in the X2 direction, the protrusion 25Y2 pushes away the locking protrusion 36Y2d in the Z1 direction and enters the slit 36Y2 through the entry 36Y2c as shown in FIG. 18B. The protrusion 25Y2 reaches the final position where it is stopped by the stopper step 36Y2e. When the protrusion 25Y2 reaches the final position, the protrusion 26Y2 also fits into the slit 37Y2.

The protrusions 25Y1 and 26Y1 on the side plate 22Y1 are fit into the slit 36Y1 and 37Y1, respectively, in substantially the same manner.

Through the above process, the upper-half case 20 is attached to and placed just above the lower-half case 30, and the case 11 is completed. With the upper-half case 20 and the lower-half case 30 combined, the top plate 21 covers the transceiver module 50 and the button battery holder 70. The side plates 22Y1 and 22Y2 are in contact with the outer surfaces of the corresponding side plates 32Y1 and 32Y2. The side plate 22Y1 covers the opening 39. The lower ends of the side plates 22Y1 and 22Y2 are covered, respectively, by the projecting parts 35Y1 and 35Y2. The side plate 22X2 is in contact with the inner surface of the side plate 32X2. The protrusion 23 is in contact with the top end of the side plate 32X1.

Thus, the upper half case 20 is joined to the lower-half case 30 at two distant positions in the Y1 side and two distant positions in the Y2 side (protrusions and slits).

Also, when the protrusion 25Y2 reaches the final position in the slit 36Y2, the locking protrusion 36Y2d returns to its normal position and locks the protrusion 25Y2 (the protrusion 25Y1 is also locked in a similar manner). Thus, the upper-half case 20 is firmly attached to the lower-half case 30.

Through the above process, the transceiver 10 is assembled.

<Installation of Button Battery>

To use the transceiver 10, it is necessary to install the button battery 80 in the button battery holder 70. As shown in FIG. 1, the button battery 80 has an anode 81 on the Z1 side and a cathode 82 on the circumferential surface and the Z2 side.

The transceiver module 50 is supplied with electric power from the button battery 80 installed in the button battery holder 70, and sends and receives signals.

To install the button battery 80, it is necessary to detach the upper-half case 20 from the lower-half case 30. The upper-half case 20 can be detached by firmly pushing the X2 end of the upper-half case 20 in the X1 direction, for example, with a finger. When the upper-half case 20 is pushed in the X1 direction, the protrusion 25Y2 pushes away the locking protrusion 36Y2d and comes out of the slit 36Y2 and the protrusion 26Y2 also comes out of the slit 37Y2.

Figure 19A:
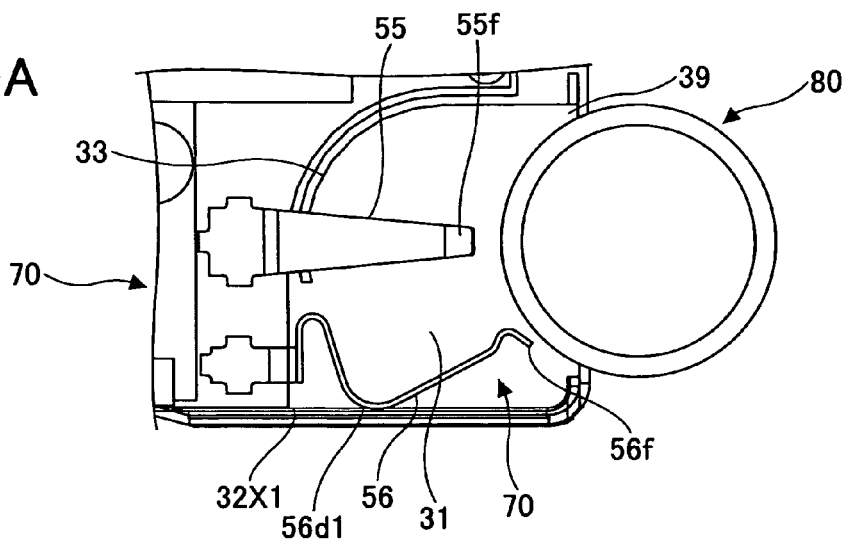
FIGS. 19A through 19C are plan views illustrating how to insert a button battery 80 into the button battery holder 70.
Figure 19B:
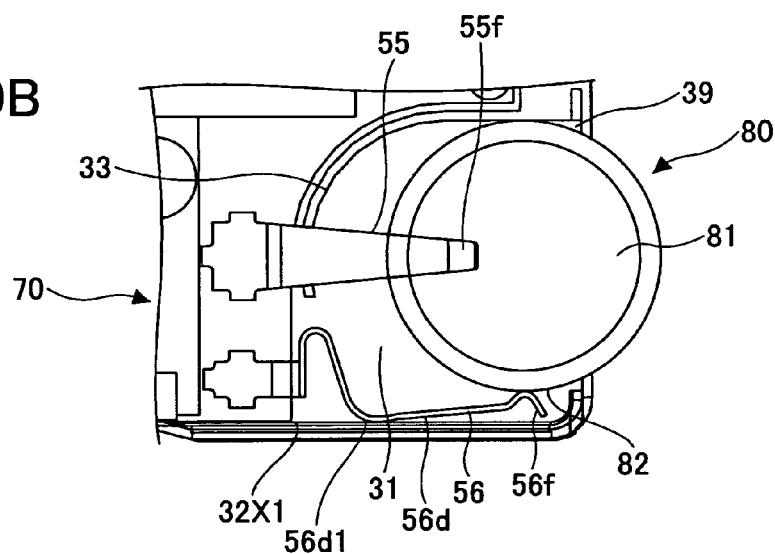
Figure 19C:
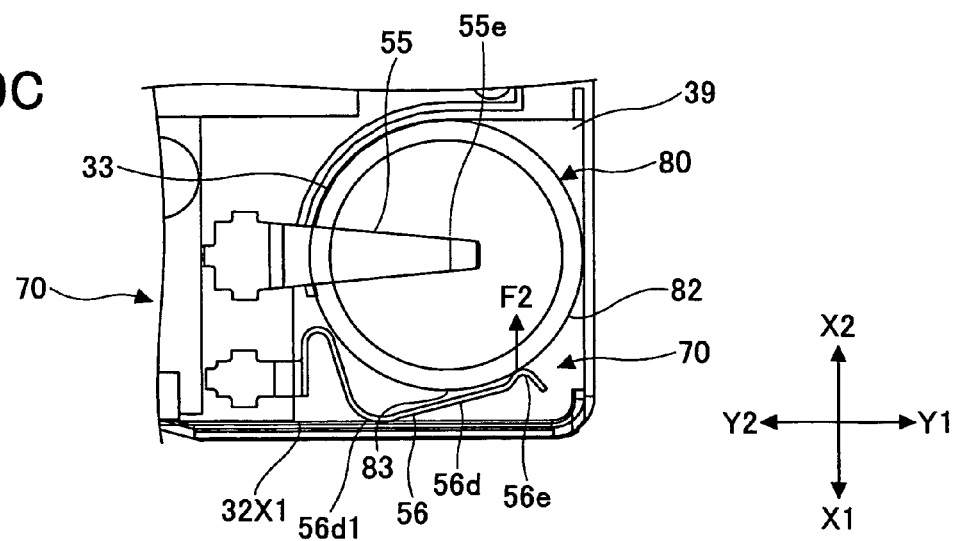
Figure 20A:
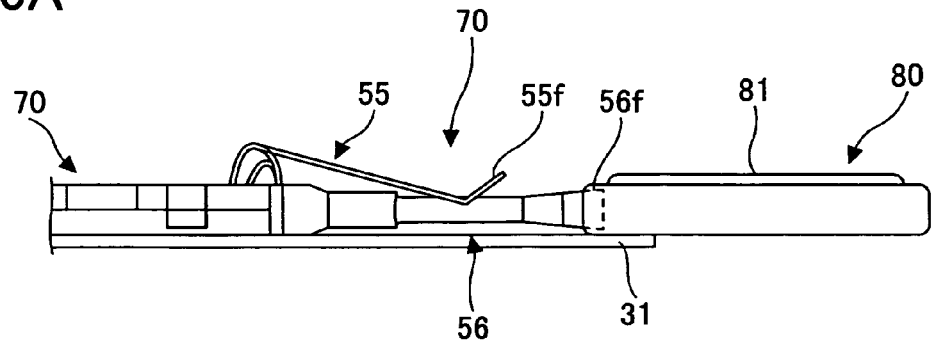
FIGS. 20A through 20C are side views illustrating how to insert the button battery 80 into the button battery holder 70.
Figure 20B:
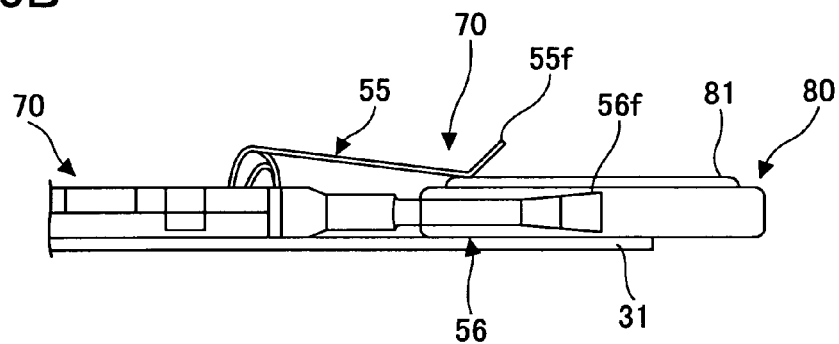
Figure 20C:
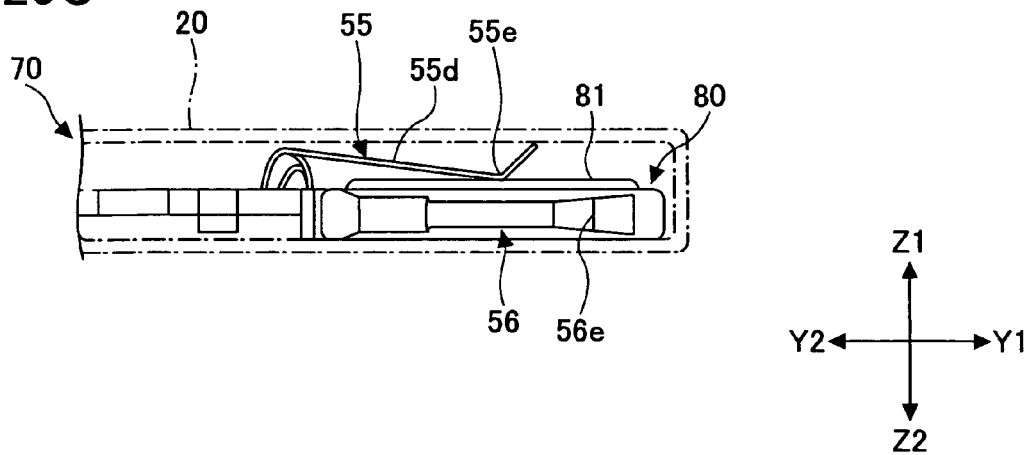

After the upper-half case 20 is detached, the button battery 80, with the anode 81 facing in the Z1 direction, is inserted in the opening 39, placed on the bottom plate 31, and pushed firmly in the Y2 direction as shown in FIGS. 19A and 20A. When pushed in the Y2 direction, the button battery 80 pushes away the button battery guide 55f and thereby causes the negative electrode 55 to elastically bend in the Z1 direction as shown in FIG. 20B. At the same time, the button battery 80 pushes away the button battery guide 56f and thereby causes the positive electrode 56 to elastically bend in the X1 direction as shown in FIG. 19B. The button battery 80 is further pushed in the Y2 direction until it touches the partition 33 and is thereby installed in the button battery holder 70 as shown in FIGS. 19C and 20C.

With the button battery 80 installed in the button battery holder 70, the terminal part 55e of the negative electrode 55 touches the anode 81 of the button battery 80 and the terminal part 56e of the positive electrode 56 touches the cathode 82. Thus, the button battery 80 is electrically connected to the transceiver module 50.

An outermost part 83 of the circumferential surface of the button battery 80, which outermost part 83 is farthest in the X1 direction from the center, is located further inside of the button battery holder 70 than the terminal part 56e. The terminal part 56e pushes a part of the button battery 80, which part is a distance away from the outermost part 83 in the Y1 direction, by the force F2 in the X2 direction. Thus, the button battery 80 is held and biased toward the partition 33 by the positive electrode 56 so as not to easily come off the button battery holder 70.

When the positive electrode 56 is pressed by the button battery 80 being pushed into the button battery holder 70, the bottom part 56d1 touches the inner surface of the side plate 32X1 and limits the movement of the positive electrode 56 in the X1 direction. This configuration makes it possible to cause the flat spring part 56d to be bent in the X1 direction, thereby to generate a sufficient force F2, and to firmly hold the button battery 80 in the button battery holder 70.

After the button battery 80 is installed, the upper-half case 20 is attached to the lower-half case 30 as described above. With the button battery 80 installed and the upper-half case 20 attached, the transceiver 10 can be used by operating the knobs 65a and 66a.

The button battery 80 installed in the button battery holder 70 can be removed by firmly pushing it in the Y1 direction, for example, with a finger.

As shown in FIGS. 2, 3, and 4A, the knobs 65a and 66a are located, respectively, in the recesses 45X2 and 45X1 formed in the case 11, and the tip surfaces of the knobs 65a and 66a, respectively, are substantially in the same planes as those of the external surfaces of the side plates 32X1 and 32X2. This configuration makes it possible to prevent unintentional operations of the knobs 65a and 66a by the user holding the transceiver 10 in hand and to prevent the knobs 55a and 56a from being moved when the transceiver 10 is pressed against something or when the transceiver 10 drops on the floor.

As shown in FIG. 2, a strap 90 can be attached to the transceiver 10 by putting it through the holes 47 and 48 in the lower-half case 30.

Also, as indicated by a dashed-two dotted line in FIG. 2, a circular hole 29 may be formed in the top plate 21 of the upper-half case 20 at a position corresponding to the coaxial connector 63. The opening 29 makes it possible to connect a coaxial connector on one end of a coaxial cable extending from a tester to the coaxial connector 63 and to measure the characteristics of the UWB antenna unit 60 without opening the case 11.

Figure 21A:
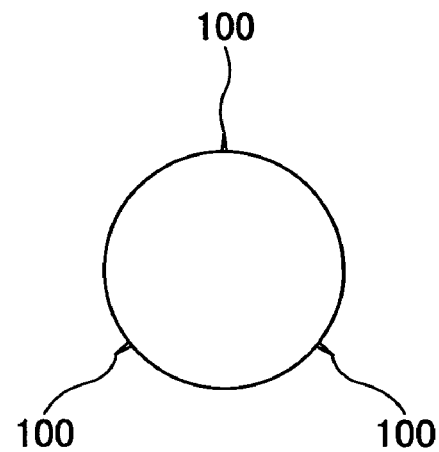
FIGS. 21A and 21B are enlarged views of a pillar 41A that is a first variation of the pillar 41-1.
Figure 21B:
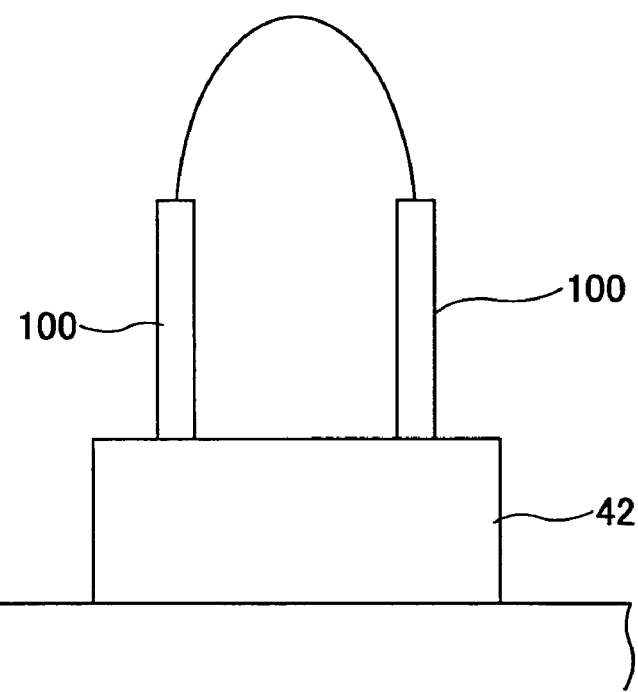

FIGS. 21A and 21B are enlarged views of a pillar 41A that is a first variation of the pillar 41-1. The configuration of the pillar 41A may also be applied to the pillars 41-2 and 41-3. The pillar 41A includes fins 100 in place of the ribs 44. When the pillar 41A is press-fit into the through hole 54-1 of the circuit board 51, the fins 100 are squashed.

Figure 22A:
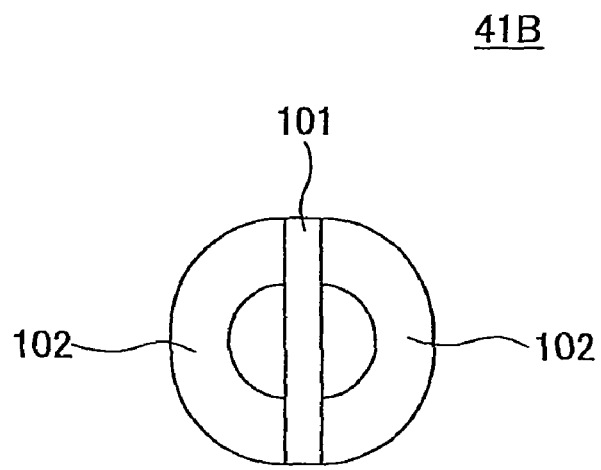
FIGS. 22A and 22B are enlarged views of a pillar 41B that is a second variation of the pillar 41-1.
Figure 22B:
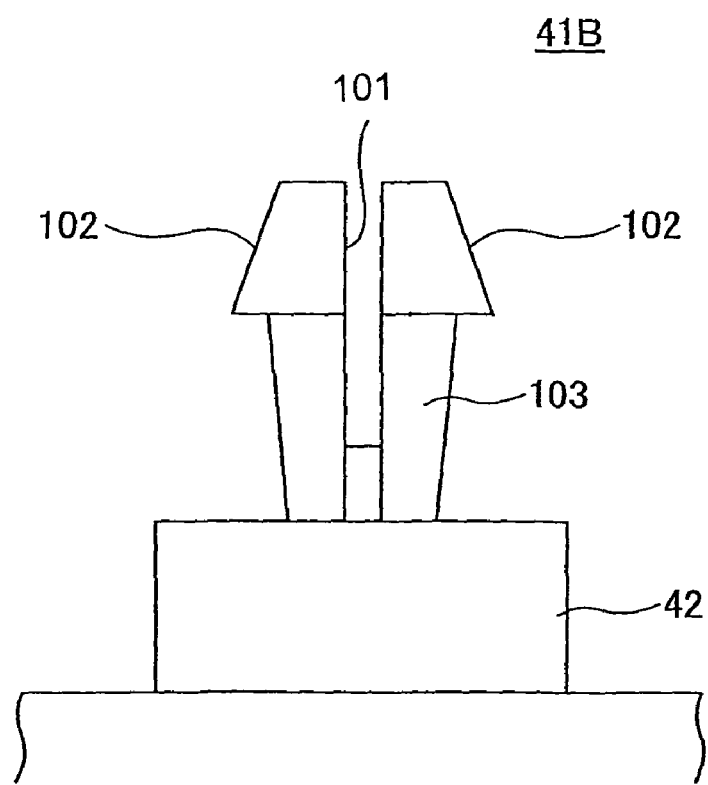

FIGS. 22A and 22B are enlarged views of a pillar 41B that is a second variation of the pillar 41-1. The configuration of the pillar 41B may also be applied to the pillars 41-2 and 41-3. The pillar 41B includes a column 103 having a cut 101 partially dividing it into two parts from the top, and overhanging, conical hooks 102 on the corresponding parts of the column 103. When the hooks 102 go through the through hole 54-1, they are pressed inward and the top part of the pillar 41B becomes smaller in diameter. Then, when the pillar 41B is pushed further into the through hole 54-1 until the pedestal 42 touches the circuit board 51, the hooks 102 return to their original positions and engage an upper-surface portion of the circuit board 51 surrounding the through hole 54-1.

The present invention may be applied not only to a transceiver using a button battery but also to transceivers using other types of thin batteries.

Embodiments of the present invention provide a transceiver including a case, a transceiver module, and a battery holder where the battery holder is formed alongside the transceiver module by using a part of the case such that the battery holder and the transceiver module do not overlap each other. This configuration eliminates the need of a separate battery holding module and makes it possible to reduce the thickness of a transceiver.

The present invention is not limited to the specifically disclosed embodiments, and variations and modifications may be made without departing from the scope of the present invention.

The present application is based on Japanese Priority Application No. 2007-184445 filed on Jul. 13, 2007 with the Japanese Patent Office, the entire contents of which are hereby incorporated herein by reference.

What is claimed is:

1. A transceiver, comprising:
   a case;
   a transceiver module housed in the case and configured to send and receive a signal; and
   a battery holder configured to hold a battery supplying electric power to the transceiver module;
   the battery holder being formed using a part of the case and being disposed alongside the transceiver module so as not to overlap the transceiver module,
   the case comprising a lower-half case having a slit extending laterally, in which lower-half case the transceiver module is fixed, and an upper-half case having a protrusion,
   the protrusion of the upper-half case being configured to fit into the slit of the lower-half case when the upper-half case is slid sideways with respect to the lower-half case and thereby to join the upper-half case and the lower-half case, and
   the slit of the lower-half case having a narrow entry and the protrusion of the upper-half case being configured to be pressed into the slit through the entry and to be locked in the slit.

2. The transceiver as claimed in claim 1, wherein
   the transceiver module includes a circuit board having a cut-out with a size and a shape corresponding to those of the battery; and
   the battery holder is formed by the cut-out of the circuit board and the part of the case which part corresponds to the cut-out.

3. The transceiver as claimed in claim 2, wherein the transceiver module and the battery holder are disposed such that the circuit board is located at a height within a thickness of the battery held in the battery holder.

4. The transceiver as claimed in claim 2, wherein
   the battery holder includes a negative electrode to be brought into contact with an anode of the battery and a positive electrode to be brought into contact with a cathode of the battery;
   one end of the negative electrode and one end of the positive electrode are attached to the circuit board; and
   the other end of the negative electrode and the other end of the positive electrode protrude into the cut-out of the circuit board.

5. The transceiver as claimed in claim 2, wherein
   the circuit board is shaped like a quadrangle;
   the cut-out is formed in one side of the circuit board; and
   an antenna unit of the transceiver module is formed in the other side of the circuit board.

6. The transceiver as claimed in claim 5, wherein
   the antenna unit includes a home-plate-shaped element pattern and a ground pattern that are disposed such that a vertex of the element pattern is positioned close to an edge of the ground pattern; and
   the element pattern is positioned as far away as possible from the battery holder.

7. The transceiver as claimed in claim 1, wherein the lower-half case includes a pillar to be press-fit into a through hole of the transceiver module to fix the transceiver module, the pillar having a protrusion on a circumferential surface thereof which protrusion is squashed when the pillar is press-fit into the through hole.

8. The transceiver as claimed in claim 1, further comprising:
   a knob used to operate the transceiver;
   wherein the knob is disposed in a recess formed in a side surface of the case.

9. The transceiver as claimed in claim 1, wherein the battery is a button battery and the battery holder is configured to hold the button battery.

10. A transceiver, comprising:
    a case;
    a transceiver module housed in the case and configured to send and receive a signal; and
    a battery holder configured to hold a battery supplying electric power to the transceiver module;
    the battery holder being formed using a part of the case and being disposed alongside the transceiver module so as not to overlap the transceiver module,
    the case comprising a lower-half case having a slit extending laterally, in which lower-half case the transceiver module is fixed, and an upper-half case having a protrusion, the protrusion of the upper-half case being configured to fit into the slit of the lower-half case when the upper-half case is slid sideways with respect to the lower-half case and thereby to join the upper-half case and the lower-half case, and the slit of the lower-half case comprising a stopper step that stops the protrusion of the upper-half case from entering further into the slit and an extension slit extending further from the stopper step.

* * * * *